United States Patent
Wakaiki et al.

(10) Patent No.: US 9,755,498 B2
(45) Date of Patent: Sep. 5, 2017

(54) SEMICONDUCTOR DEVICE, AND INVERTER, CONVERTER AND POWER CONVERSION DEVICE EMPLOYING THE SAME

(71) Applicant: Sharp Kabushiki Kaisha, Sakai-shi, Osaka (JP)

(72) Inventors: Shuji Wakaiki, Sakai (JP); Akihide Shibata, Sakai (JP); Hiroshi Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/214,497

(22) Filed: Jul. 20, 2016

(65) Prior Publication Data

US 2017/0093272 A1 Mar. 30, 2017

(30) Foreign Application Priority Data

Sep. 30, 2015 (JP) ................... 2015-194087

(51) Int. Cl.
| | |
|---|---|
| *H02M 1/088* | (2006.01) |
| *H02M 7/537* | (2006.01) |
| *H02M 3/158* | (2006.01) |
| *H03K 17/10* | (2006.01) |
| *H03K 17/16* | (2006.01) |

(52) U.S. Cl.
CPC ........... *H02M 1/088* (2013.01); *H02M 3/158* (2013.01); *H02M 7/537* (2013.01); *H03K 17/102* (2013.01); *H03K 17/164* (2013.01)

(58) Field of Classification Search
CPC ...... H02M 1/088; H02M 3/158; H02M 7/537; H02M 2001/0054; H02M 2003/078; H02M 3/145; H02M 1/08; H02M 1/092; H02M 1/096; H03K 2005/00215; H03K 2005/00221; H03K 17/10; H03K 17/102; H03K 17/164

See application file for complete search history.

(56) References Cited

U.S. PATENT DOCUMENTS

| | | | | |
|---|---|---|---|---|
| 4,449,158 A | * | 5/1984 | Taira | ................... H01L 27/0251 257/379 |
| 2001/0024138 A1 | * | 9/2001 | Dohnke | ................ H01L 27/085 327/434 |

(Continued)

FOREIGN PATENT DOCUMENTS

JP 2002-95240 A 3/2002

*Primary Examiner* — Gustavo Rosario Benitez
(74) *Attorney, Agent, or Firm* — Keating & Bennett, LLP

(57) ABSTRACT

A boost circuit includes multiple switching circuits connected in parallel. Each switching circuit includes first through third transistors and a resistor. The first transistor, the resistor, and the second transistor are serially connected between first and second nodes. The third transistor is connected between the source of the first transistor and the second node. A conductance Gm (S) of the second transistor and a resistance r (Ω) of the resistor are respectively configured to be within ranges of $1 \leq Gm \leq 1000$ and $7 \times Gm^{-1.6} \leq r \leq 170 \times Gm^{-1}$. Since the first transistor having a high breakdown voltage is turned on by turning on the second transistor, variations in turn-on time of the boost circuit are reduced.

12 Claims, 18 Drawing Sheets

(56) References Cited

U.S. PATENT DOCUMENTS

| | | | |
|---|---|---|---|
| 2006/0091962 A1* | 5/2006 | Kim | H03F 1/223 330/311 |
| 2014/0028375 A1* | 1/2014 | Komiya | H03K 17/102 327/427 |
| 2014/0167721 A1* | 6/2014 | Ito | H02M 1/08 323/282 |
| 2015/0084685 A1* | 3/2015 | Hirose | H03K 17/302 327/382 |
| 2015/0155863 A1* | 6/2015 | Takasu | H03K 17/08142 327/108 |
| 2016/0087623 A1* | 3/2016 | Yamaguchi | H03K 17/161 327/109 |

* cited by examiner

SEMICONDUCTOR DEVICE, AND INVERTER, CONVERTER AND POWER CONVERSION DEVICE EMPLOYING THE SAME

BACKGROUND

1. Field

The present disclosure relates to a semiconductor device, and an inverter, a converter and a power conversion device employing the semiconductor device. In particular, the present disclosure relates to a semiconductor device having a high breakdown voltage transistor, and an inverter, a converter and a power conversion device employing the semiconductor device.

2. Description of the Related Art

Power conversion devices of relate art employ a high breakdown voltage transistor. There is also a method of using multiple high breakdown voltage transistors connected in parallel to allow a power conversion device to have an increased rated current. This method is intended to control the concentration of current on a high breakdown voltage transistor having a lower threshold voltage from among multiple high breakdown voltage transistors. To this end, a current flowing through each high breakdown voltage transistor is detected. When a difference between the currents of the multiple high breakdown voltage transistors becomes higher than a predetermined value, the resistance value of a gate resistor is configured to be lower than a standard value to turn on the multiple transistors earlier. Related art technique is disclosed Japanese Unexamined Patent Application Publication No. 2002-95240, for example.

The power conversion device of related art suffers from variations in turn-on time caused by variations in the threshold voltage of the high breakdown voltage transistors. Variations in the performance of the power conversion device thus result.

The method described in Japanese Unexamined Patent Application Publication No. 2002-95240 uses as many current sensors as the high breakdown voltage transistors, each gate resistor configured to be a variable resistor, and a controller to control resistance of the variable resistor on the basis of the detection result of the current sensor. Accordingly, the configuration of the device is complicated, resulting in high costs.

SUMMARY

It is desirable to provide a semiconductor device having smaller performance variations, and an inverter, a converter, and a power conversion device including the semiconductor.

According to an aspect of the disclosure, there is provided a semiconductor device. The semiconductor device includes multiple switching circuits connected in parallel between a first node and a second node. Each of the switching circuits includes first switching element having a first electrode connected to the first node, a second switching element having a first electrode connected to a second electrode of the first switching element, and a second electrode connected to the second node, and a third switching element connected in parallel with the second switching element. A breakdown voltage between the first electrode and the second electrode of the first switching element is higher than a breakdown voltage between the first electrode and the second electrode of each of the second switching element and the third switching element. An on-resistance value of the second switching element is higher than an on-resistance value of the third switching element. Control electrodes of the first switching elements are connected together to a first control terminal. Control electrodes of the second switching elements are connected together to a second control terminal. Control electrodes of the third switching elements are connected together to a third control terminal. The first switching element includes a first transistor. The second switching element includes a first resistor and a second transistor connected in series. The third switching element includes a third transistor. Let r represent a resistance (Ω) of the first resistor and Gm a conductance (S) of the second transistor, and $1 \leq Gm \leq 1000$ and $7 \times Gm^{-1.6} \leq r \leq 170 \times Gm^{-1}$ hold.

According to another aspect of the disclosure, there is provided a semiconductor device. The semiconductor device includes a first switching element having a first electrode connected to a first node, a second switching element having a first electrode connected to a second electrode of the first switching element and a second electrode connected to a second node, and a third switching element connected in parallel with the second switching element. A breakdown voltage between the first electrode and the second electrode of the first switching element is higher than a breakdown voltage between the first electrode and the second electrode of each of the second switching element and the third switching element. An on-resistance value of the second switching element is higher than an on-resistance value of the third switching element. In order to establish an electrically conducting state between the first node and the second node, the third switching element is turned on after turning on the first switching element by turning on the second switching element. The first switching element includes a first transistor, the second switching element includes a resistor and a second transistor connected in series, and the third switching element includes a third transistor. Let r represent a resistance (Ω) of the resistor and Gm a conductance (S) of the second transistor, and $1 \leq Gm \leq 1000$ and $7 \times Gm^{-1.6} \leq r \leq 170 \times Gm^{-1}$ hold.

DESCRIPTION OF THE EMBODIMENTS

First Embodiment

Figure 1:
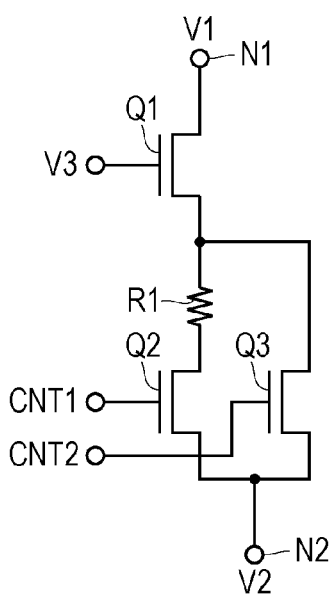
FIG. 1 is a circuit diagram illustrating a configuration of a semiconductor device of a first embodiment of the disclosure.

A semiconductor device of a first embodiment includes a first switching element having a first electrode connected to a first node, a second switching element having a first electrode connected to a second electrode of the first switching element, and a second electrode connected to a second node, and a third switching element connected in parallel with the second switching element. A breakdown voltage between the first electrode and the second electrode of the first switching element is higher than a breakdown voltage between the first electrode and the second electrode of each of the second switching element and the third switching element. An on-resistance value of the second switching element is higher than an on-resistance value of the third switching element. In order to establish an electrically conducting state between the first node and the second node, the third switching element is turned on after turning on the first switching element by turning on the second switching element. The semiconductor device of the first embodiment is described in detail with reference to the drawings.

The semiconductor device of the first embodiment includes N-channel metal oxide semiconductor (MOS) transistors Q1 through Q3 and a resistor R1. The drain of the transistor Q1 is connected to a node N1. One end of the resistor R1 is connected to the source of the transistor Q1. The drain of the transistor Q2 is connected to the other end of the resistor R1, and the source of the transistor Q2 is connected to a node N2. The drain of the transistor Q3 is connected to the one end of the resistor R1 and the source of the transistor Q3 is connected to the node N2. The transistor Q1 forms the first switching element, the transistor Q2 and the resistor R1 form the second switching element, and the transistor Q3 forms the third switching element.

The transistor Q1 is a high breakdown voltage transistor, and each of the transistors Q2 and Q3 is a low breakdown voltage transistor. The transistor Q1 that is commercially available has a threshold voltage VT1 varying in a range of 4 V to 7 V. The transistors Q2 and Q3 that are commercially available have threshold voltages VT2 and VT3, respectively, varying in a range of 1 V to 2 V. The transistors Q2 and Q3 may or may not be identical in terms of type and characteristics. However, if the transistors Q2 and Q3 are identical in type, the number of component types to be used is reduced. The resistance of the resistor R1 may be 70 m$\Omega$, for example.

The on-resistance of each of the transistors Q2 and Q3 ranges from 1 m$\Omega$ to 300 m$\Omega$, for example. The resistance of the resistor R1 reduces the effect of variations in the threshold voltage VT1 of the transistor Q1, and is configured to be approximately equal to or higher than the on-resistance value of the transistors Q2 and Q3 (for example, 1 m$\Omega$ to 10$\Omega$) such that the loss across the resistor R1 is equal to or below 0.1% of input power.

The second switching element including the transistor Q2 and the resistor R1 has an on-resistance value lower than the on-resistance value of the third switching element including the transistor Q3 alone. The third switching element serves as a bypath circuit for the second switching element. To turn on the semiconductor device, the transistor Q3 is turned on 100 ns later than when the transistor Q2 is turned on such that a current flows through the transistor Q3 having a lower on-resistance value. To turn off the semiconductor device, the transistor Q2 is turned off 100 ns later than when the transistor Q3 is turned off. The semiconductor device may be turned on and off at 10 kHz with the resistor R1 configured to be 10$\Omega$, and a current of 5 A caused to flow through the resistor R1, the loss across the resistor R1 is 5 A×5 A×10$\Omega$×100 ns×2 (twice including an on operation and an off operation)×10 kHz=1 W. If the input power is 1000 W, the loss across the resistor R1 is 0.1 percent of the input power.

The threshold voltage VT1 of the transistor Q1 is found to be VT1>VT1_min on a data sheet of the transistor Q1, I1 represents a current flowing through the resistor R1 and the transistor Q1, Vg1 represents a gate voltage of the transistor Q1, r represents a resistance of the resistor R1, and rq represents an on-resistance value of the transistor Q2 when the current I1 flows through the transistor Q2, and the following formula (1) holds:

$$I1<(VG1-VT1\_min)/(r+rq) \quad (1)$$

Even if the threshold voltage VT1 of the transistor Q1 varies, the current I1 flowing through the transistor Q1 is limited to a value within a safe operation range by configuring the resistance r of the resistor R1 to be an appropriate value.

The node N1 is supplied with a direct-current (DC) voltage V1, and the node N2 is supplied with a DC voltage V2 that is lower than the DC voltage V1, and the gate of the transistor Q1 is supplied with a DC voltage V3. A difference between the voltages V3 and V2 (V3−V2) is configured to be a voltage sufficiently higher than the threshold voltage VT1 of the transistor Q1. The gates of the transistors Q2 and Q3 are respectively supplied with control signals CNT1 and CNT2.

In an initial state, the control signals CNT1 and CNT2 are configured to be at a low (L) level. In such a case, the transistors Q1 through Q3 remain turned off, causing an electrically non-conducting state between the nodes N1 and N2.

To establish an electrically conducting state between the nodes N1 and N2, the control signal CNT1 is raised from the L level to a high (H) level. In this way, the transistor Q2 is turned on, lowering the source voltage of the transistor Q1. If the gate-source voltage of the transistor Q1 rises above the threshold voltage VT1 of the transistor Q1, the transistor Q1 is turned on, causing an electrically conducting state between the nodes N1 and N2. In succession, the control signal CNT2 is raised from the L level to the H level. The transistor Q3 is thus turned on, reducing a resistance between the nodes N1 and N2 and reducing a conduction loss.

To shift the electrically conducting state to the electrically non-conducting state between the nodes N1 and N2, the control signal CNT2 is lowered from the H level to the L level, causing the transistor Q3 to turn off. In succession, the control signal CNT1 is lowered from the H level to the L level, thereby turning off the transistor Q2. The source voltage of the transistor Q1 rises, causing the gate-source voltage of the transistor Q1 to be lower than the threshold voltage VT1 of the transistor Q1. The transistor Q1 is then turned off.

In accordance with the first embodiment, the second switching element (the transistor Q2 and the resistor R1) having a higher on-resistance value switches the transistor Q1 having a higher breakdown voltage. The effect of variations in the threshold voltage VT1 of the transistor Q1 on variations in the drain current of the transistor Q1 is thus reduced, leading to reducing variations in the turn-on time of the semiconductor device.

Figure 2:
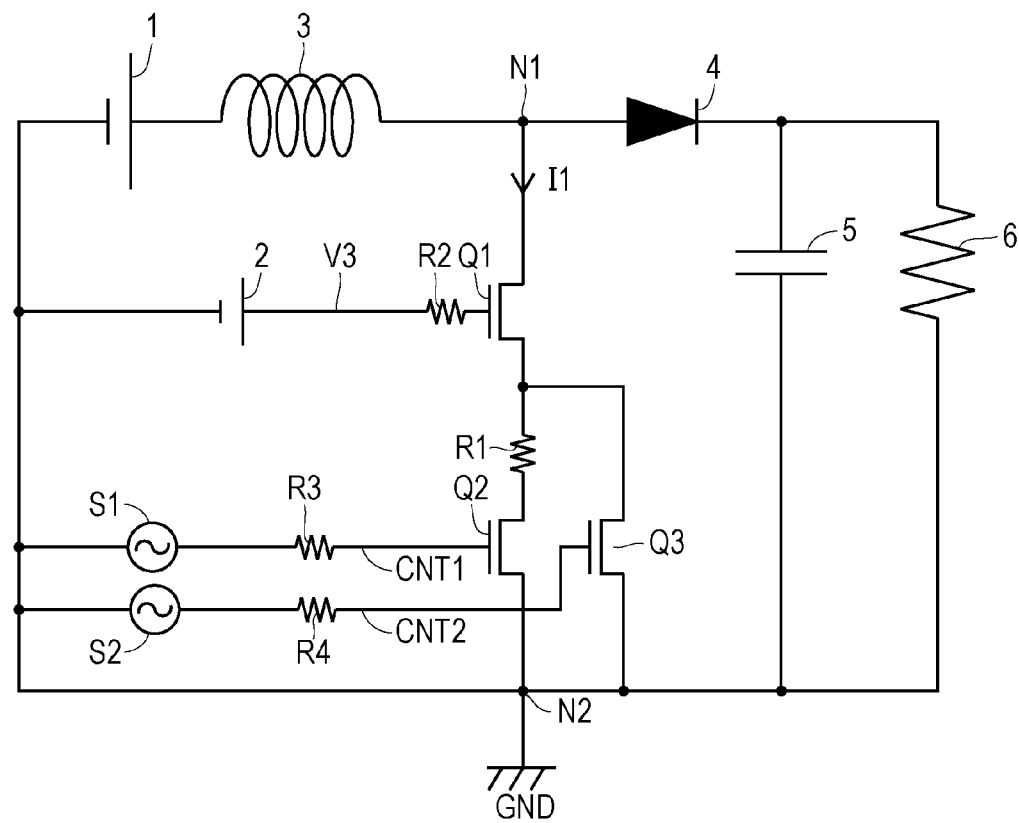
FIG. 2 is a circuit diagram illustrating a configuration of a boost chopper employing the semiconductor device illustrated in FIG. 1.

FIG. 2 is a circuit diagram illustrating a configuration of a boost chopper employing the semiconductor device illustrated in FIG. 1. As illustrated in FIG. 2, the boost chopper is a circuit that boosts an output voltage of a DC power source 1 and supplies the boosted voltage to a load circuit 6. The boost chopper includes N-channel MOS transistors Q1 through Q3, resistor R1, control signal sources S1 and S2, gate resistors R2 through R4, DC power source 2, reactor 3, diode 4, and capacitor 5.

The transistor Q1, the resistor R1, and the transistor Q2 are connected in series between the nodes N1 and N2. The transistor Q3 is connected between the source of the transistor Q1 and the node N2. The node N2 is connected to a ground voltage GND line. The reactor 3 is connected between the positive electrode of the DC power source 1 and the node N1. The diode 4 is configured with the anode thereof connected to the node N1 and the cathode thereof connected to the ground voltage GND line via the capacitor 5. The load circuit 6 is connected in parallel with the capacitor 5.

The gate resistor R2 is connected between the positive electrode of the DC power source 2 and the gate of the transistor Q1. The gate resistor R3 is connected between the output node of the control signal source S1 and the gate of the transistor Q2. The gate resistor R4 is connected between the output node of the control signal source S2 and the gate of the transistor Q3. The negative electrodes of the DC power sources 1 and 2 are grounded, and the ground nodes of the control signal sources S1 and S2 are grounded.

The reactance of the reactor 3 is 5 mH, for example. An SiC Schottky barrier diode is used for the diode 4, for example. The capacitance of the capacitor 5 is 200 µF, for example. A resistor having a resistance of 7.8Ω is used as the load circuit 6. The control signal sources S1 and S2 respectively output the control signals CNT1 and CNT2. Each of the control signals CNT1 and CNT2 is a 10 kHz rectangular wave signal.

Figure 3:
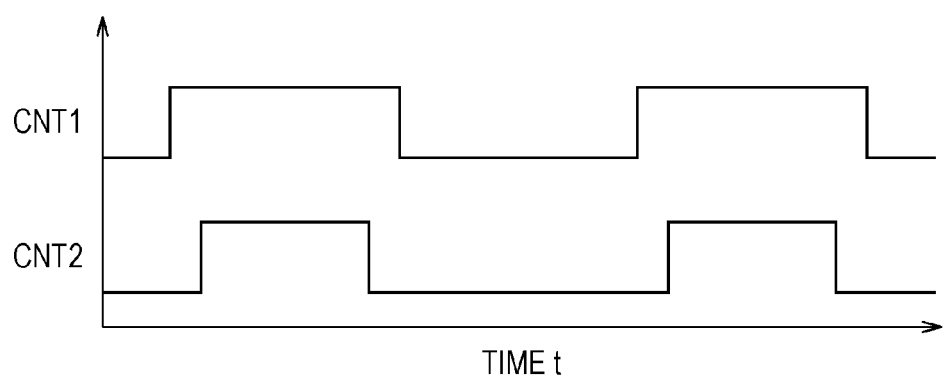
FIG. 3 is a timing diagram illustrating waveforms of control signals of FIG. 2.

In order to turn on the transistors Q1 through Q3 as illustrated in FIG. 3, the control signal CNT2 is raised from the L level to the H level after raising the control signal CNT1 from the L level to the H level. Conversely, to turn off the transistors Q1 through Q3, the control signal CNT1 is lowered from the H level to the L level after lowering the control signal CNT2 from the H level to the L level.

Turning to FIG. 2, when the transistors Q1 through Q3 are turned on, a DC current flows from the DC power source 1 through the reactor 3 and the semiconductor device (the transistors Q1 through Q3 and the resistor R1) to the ground voltage GND line. The reactor 3 stores electromagnetic energy. When the transistors Q1 through Q3 are turned off, the electromagnetic energy stored on the reactor 3 is released to the capacitor 5 via the diode 4. The voltage across the terminals of the capacitor 5, namely, an output voltage of the boost chopper is a voltage that is a sum of the output voltage of the DC power source 1 and the voltage across the terminals of the reactor 3.

Figure 4:
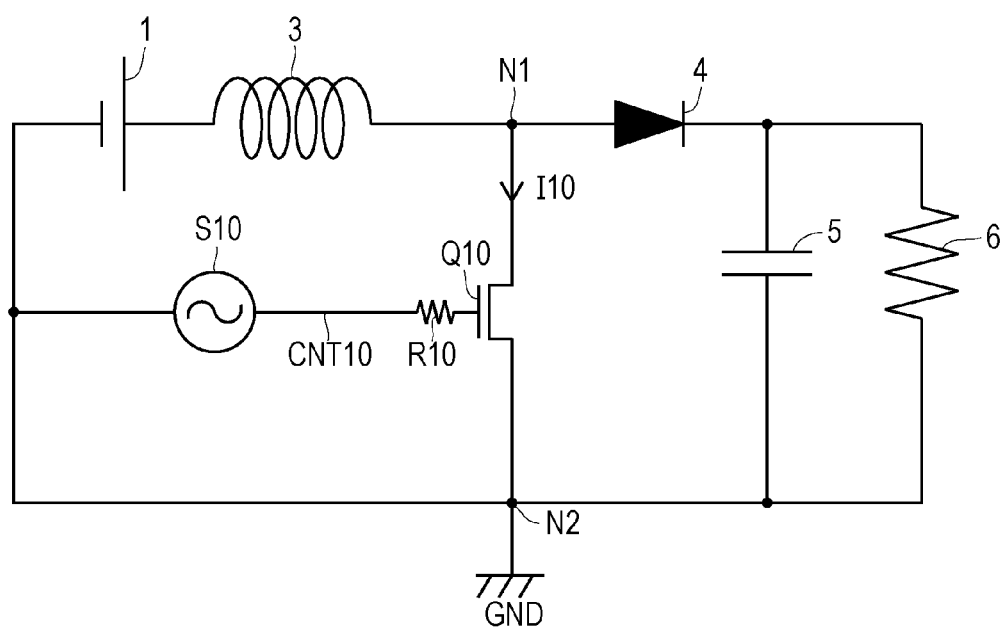
FIG. 4 is a circuit diagram illustrating a comparative example to the first embodiment.

FIG. 4 is a circuit diagram of a boost chopper of related art illustrated as a comparative example to the first embodiment. The boost chopper of FIG. 4 is comparable to the boost chopper of FIG. 2. Referring to FIG. 4, the boost chopper includes an N-channel MOS transistor Q10 connected between the nodes N1 and N2. The gate of the transistor Q10 is connected to the output node of a control signal source S10 via a gate resistor R10. The control signal source S10 outputs a control signal CNT10 that is a 10 kHz rectangular wave signal. The ground node of the control signal source S10 is grounded. The transistor Q10 is a high breakdown voltage transistor that is similar in type to the transistor Q4.

If the control signal CNT10 is raised from the L level to the H level, the transistor Q10 is turned on, storing electromagnetic energy on the reactor 3. If the control signal CNT10 is lowered from the H level to the L level, the transistor Q10 is turned off, releasing the electromagnetic energy from the reactor 3 to the capacitor 5.

Figure 5:
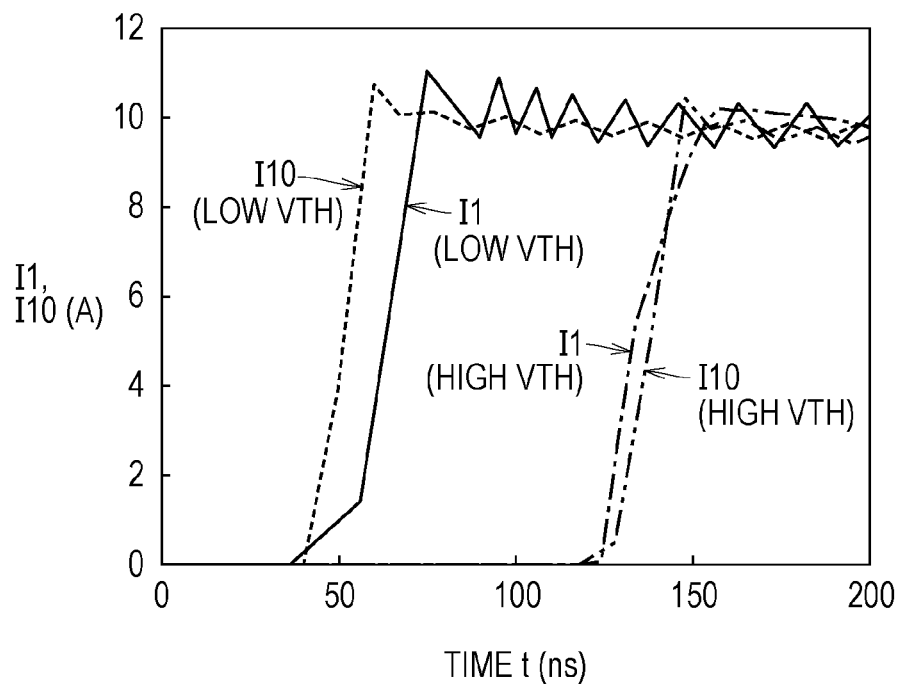
FIG. 5 is a timing diagram illustrating the effect of the disclosure.

FIG. 5 is a timing diagram illustrating the waveform of the current I1 flowing through the transistor Q1 in response to the rising edge of the control signal CNT1 in the boost chopper of the disclosure illustrated in FIG. 2 and the waveform of a current I10 flowing through the transistor Q10 in response to the rising edge of the control signal CNT10 in the boost chopper of related art of FIG. 4.

Even of the same transistor products, the threshold voltages VT of the transistors Q vary within a predetermined range. Commercially available high breakdown voltage transistors Q1 and Q10 have variations in the threshold voltage VT within a range from 4 V to 7 V. Commercially available low breakdown voltage transistors Q2 and Q3 have variations in the threshold voltage VT within a range from 1 V to 3 V. When the control signal CNT is raised from the L level to the H level, and the level of the control signal CNT exceeds the threshold voltage VTH of the transistor Q, the transistor Q turns on. Even if the same control signal CNT is applied to the gate of the transistor Q, the transistor Q having a lower threshold voltage VTH turns on earlier than the transistor Q having a higher threshold voltage VTH.

In the boost chopper of related art, the rising of the current I10 in the high breakdown voltage transistor Q10 having a low VTH (VTH10=4.2 V) is earlier by 87 ns than the rising of the current I10 in the high breakdown voltage transistor Q10 having a high VTH (VTH10=6.2 V). The rising time of the current I10 varies at least within a range of 87 ns.

In contrast, in the boost chopper of the disclosure, the rising of the current I1 with the high breakdown voltage transistor Q1 having a low VTH (VTH1=4.2 V), the low breakdown voltage transistor Q2 having a low VTH (VTH2=1.95 V), and the low breakdown voltage transistor Q3 having a low VTH (VTH3=1.95 V) is 72 ns earlier than the rising of the current I1 with the high breakdown voltage transistor Q1 having a high VTH (VTH1=6.2 V), the low breakdown voltage transistor Q2 having a high VTH (VTH2=2.85 V), and the low breakdown voltage transistor Q3 having a high VTH (VTH3=2.85 V). The rising time of the current I1 varies at least within a range of 72 ns.

The use of the semiconductor device of the disclosure controls variations in the rising time of the current in the boost chopper from 87 ns in the related art technique to 72 ns. The second switching element (the transistor Q2 and the resistor R1) having a higher on-resistance value switches the high breakdown voltage transistor Q1, thereby reducing the effect of variations in the threshold voltage VT1 of the transistor Q1 on variations in the drain current of the transistor Q1.

Figure 6:
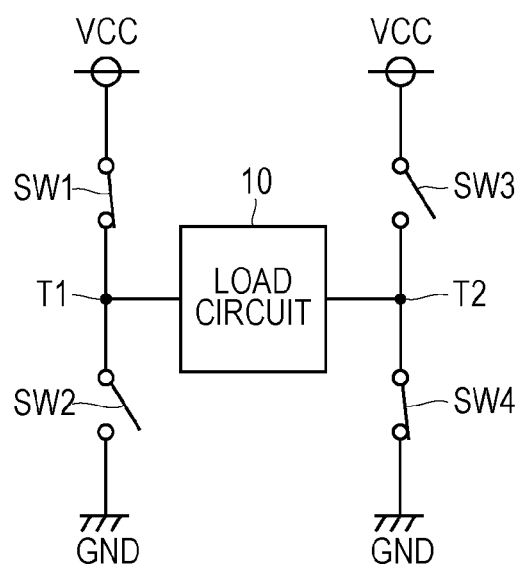
FIG. 6 is a circuit block diagram illustrating a modification of the first embodiment.

A variety of modifications of the first embodiment is described below. FIG. 6 is a circuit block diagram illustrating a configuration of an inverter as a modification of the first embodiment. Referring to FIG. 6, the inverter includes switches SW1 and SW2 serially connected between a DC power source voltage VCC line and a ground voltage GND line, an output terminal T1 connected to the junction of the switches SW1 and SW2, switches SW3 and SW4 serially connected between the DC power source voltage VCC line and the ground voltage GND line, and an output terminal T2 connected to the junction of the switches of SW3 and SW4. Each switch SW has a diode (not illustrated) inverse-parallel connected therewith. Each switch SW includes the semiconductor device of FIG. 1. A load circuit 10 is connected between output terminals T1 and T2.

When the switches SW1 and SW4 are turned on, a current flows from the DC power source voltage VCC line to the ground voltage GND line through the switch SW1, the load circuit 10, and the switch SW4. When the switches SW3 and SW2 are turned on, a current flows from the DC power source voltage VCC line to the ground voltage GND line through the switch SW3, the load circuit 10, and the switch SW2. By turning on the switches SW1 and SW4 and the switches SW2 and SW3 alternately with a desired period, DC power is converted into alternating current (AC) power, and the AC power is thus supplied to the load circuit 10. In this modification, variations in the turn-on time of the switches SW are reduced. The semiconductor device of the first embodiment is applied to a single-phase inverter in this modification. The semiconductor device of the first embodiment is applicable to a multi-phase inverter (such as a three-phase inverter).

Figure 7:
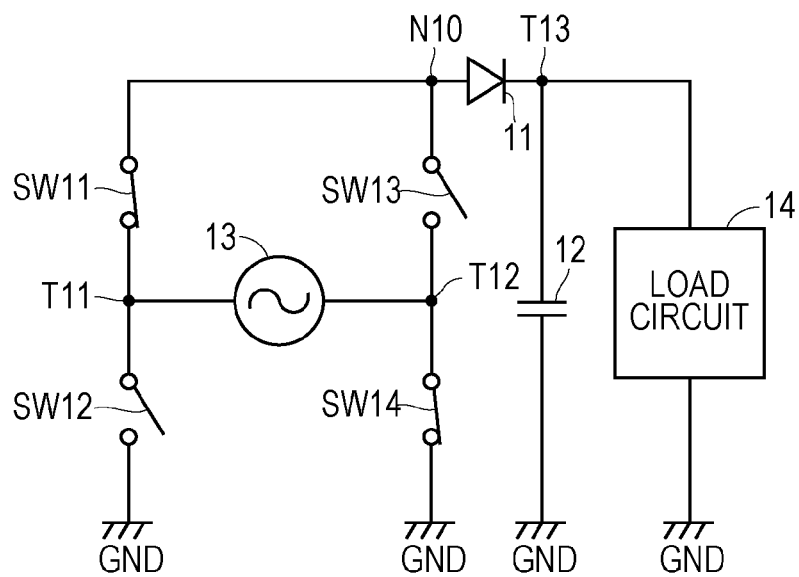
FIG. 7 is a circuit block diagram illustrating another modification of the first embodiment.

FIG. 7 is a circuit block diagram illustrating a converter as another modification of the first embodiment. Referring to FIG. 7, the converter includes switches SW11 and SW12 serially connected between a node N10 and a ground voltage GND line, an input terminal T11 connected to the junction of the switches SW11 and SW12, switches SW13 and SW14 serially connected between the node N10 and the ground voltage GND line, an input terminal T12 connected to the junction of the switches SW13 and SW14, an output terminal T13 connected to the junction of the switches SW13 and SW14, a diode 11 that is forward-connected from the node N10 to the output terminal T13, and a smoothing capacitor 12 that is connected between the output terminal T13 and the ground voltage GND line. Each switch SW includes the semiconductor device of FIG. 1. An AC power source 13 is connected between the input terminals T11 and T12. A load circuit 14 is connected between the output terminal T13 and the ground voltage GND line.

The AC power source 13 supplies an AC voltage between the input terminals T11 and T12. The switches SW11 and SW14 are turned on while the voltage at the input terminal T11 is higher than the voltage at the input terminal T12. The switches SW12 and SW13 are turned on while the voltage at the input terminal T12 is higher than the voltage at the input terminal T11.

When the switches SW11 and SW14 are turned on, a current flows from the AC power source 13 to the smoothing capacitor 12 through the switch SW11, and the diode 11, thereby charging the smoothing capacitor 12. When the switches SW12 and SW13 are turned on, a current flows from the AC power source 13 to the smoothing capacitor 12 through the switch SW13, and the diode 11, thereby charging the smoothing capacitor 12. By turning on the switches SW11 and SW14 and the switches SW12 and SW13 in synchronization with the AC voltage, the AC power is converted into the DC power, and the DC power is supplied to the load circuit 14. In this modification, variations in the turn-on time of each switch SW are reduced.

Figure 8:
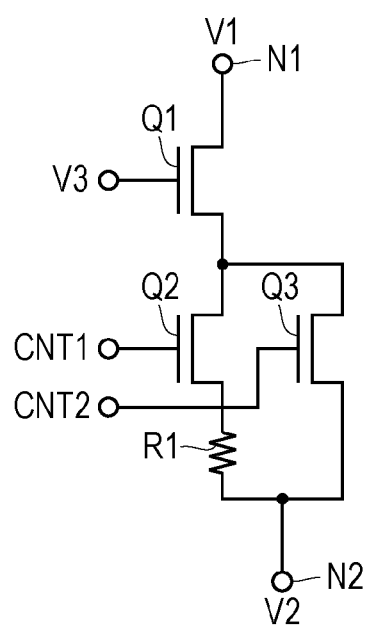
FIG. 8 is a circuit diagram illustrating another modification of the first embodiment.

FIG. 8 is a circuit diagram illustrating another modification of the first embodiment. The semiconductor device of FIG. 8 is comparable in circuit configuration to the semiconductor device of FIG. 1. The semiconductor device of FIG. 8 is different from the semiconductor device of FIG. 1 in that the resistor R1 and the transistor Q2 are connected in a reverse order. Namely, the drain of the transistor Q2 is connected to the source of the transistor Q1 and the resistor R1 is connected between the source of the transistor Q2 and the node N2. The transistor Q3 is connected between the source of the transistor Q1 and the node N2. The modification offers an effect similar to that of the first embodiment.

Figure 9:
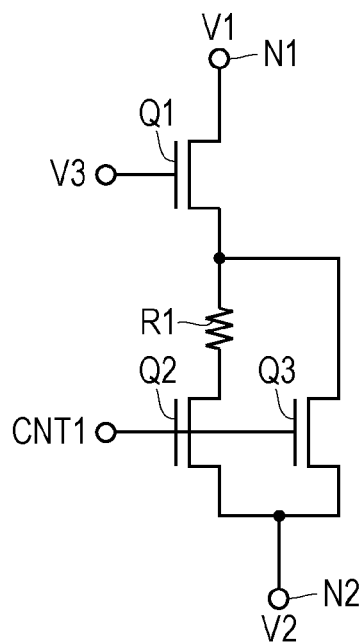
FIG. 9 is a circuit diagram illustrating another modification of the first embodiment.

FIG. 9 is a circuit diagram illustrating another modification of the first embodiment. The semiconductor device of FIG. 9 is comparable in circuit configuration to the semiconductor device of FIG. 1. The semiconductor device of FIG. 9 is different from the semiconductor device of FIG. 1 in that the control signal CNT1 is applied to the gates of the N-channel MOS transistors Q2 and Q3, and that the threshold voltage VT3 of the transistor Q3 is higher than the threshold voltage VT2 of the transistor Q2. When the control signal CNT is raised from the L level to the H level, the transistor Q3 is turned on after the transistor Q2 is turned on. Also, when the control signal CNT is lowered from the H level to the L level, the transistor Q2 is turned off after the transistor Q3 is turned off. The modification offers an effect similar to that of the first embodiment and uses a smaller number of control signals CNT.

The N-channel MOS transistors Q1 through Q3 may be replaced with bipolar transistors or insulated gate bipolar transistors (IGBTs). For example, the N-channel MOS transistors Q1 through Q3 may be replaced with first and third NPN bipolar transistors. In such a case, the collector of the first NPN bipolar transistor is connected to the node N1, and the collector of the second NPN bipolar transistor is connected to the emitter of the first NPN bipolar transistor via the resistor R1. The collector of the third NPN bipolar transistor is connected to the emitter of the first NPN bipolar transistor, and the emitter of the third NPN bipolar transistor is connected to the node N2. The base of the first NPN bipolar transistor is supplied with a DC voltage V3, and the bases of the second and third NPN bipolar transistors are respectively supplied with the control signals CNT1 and CNT2. The breakdown voltage between the collector and the emitter of the first NPN bipolar transistor is higher than the breakdown voltage between the collector and the emitter of each of the second and third NPN bipolar transistors. The modification herein also offers an effect similar to that of the first embodiment.

The first NPN bipolar transistor may be replaced with the IGBT. The collector of the IGBT is connected to the node N1. The emitter of the IGBT is connected to the second NPN bipolar transistor via the resistor R1 while also being connected to the collector of the third NPN bipolar transistor. The gate of the IGBT is supplied with the DC voltage V3. The breakdown voltage between the collector and the emitter of the IGBT is higher than the breakdown voltage between the collector and the emitter of each of the second and third NPN bipolar transistors. This modification also offers an effect similar to that of the first embodiment.

Second Embodiment

Figure 10:
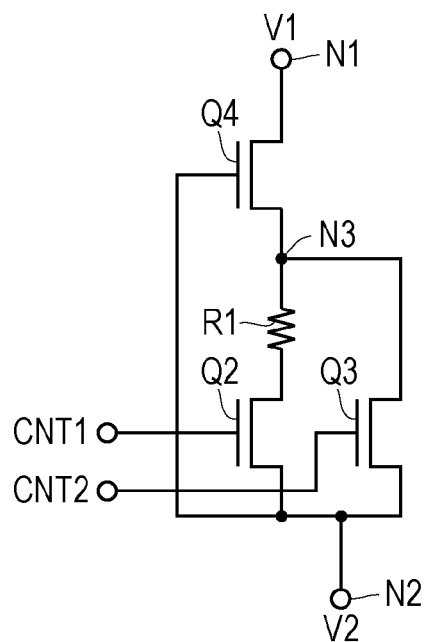
FIG. 10 is a circuit diagram illustrating a configuration of a semiconductor device of a second embodiment.

FIG. 10 is a circuit diagram illustrating a semiconductor device of a second embodiment. The semiconductor device of FIG. 10 is comparable in circuit configuration to the semiconductor device of FIG. 1. The semiconductor device of FIG. 10 is different from the semiconductor device of FIG. 1 in that the N-channel MOS transistor Q1 is replaced with a normally-on transistor Q4. The normally-on transistor Q4 may be a hetero-junction field-effect GaN transistor.

The N-channel MOS transistor Q1 has a positive threshold voltage VT1, and is turned off when a gate-source voltage is 0 V. This is why the transistor Q1 is referred to as a normally-off transistor. In contrast, a normally-on transistor Q4 has a negative threshold voltage VT4, and is turned on when the gate-source voltage is 0 V. The transistor Q4 is a high breakdown voltage transistor.

The threshold voltage VT4 of the commercially available transistor Q4 varies within a range from −3 V to −6 V. The threshold voltages VT2 and VT3 of the commercially available transistors Q2 and Q3 vary within a range from 1 V to 3 V. The transistors Q2 and Q3 are of the same type and of the same characteristics.

When the control signals CNT1 and CNT2 are at the L level, the transistors Q2 and Q3 are off. The voltage at the source of the normally-on transistor Q4 (the node N3) is higher than the sum of the absolute value of the threshold voltage VT4 and the voltage at the node N2, because of a leakage current of the transistor Q4. For this reason, the transistor Q4 is off.

When the control signal CNT1 is raised from the L level to the H level, the transistor Q2 turns on, causing the voltage at the node N3 to fall. When a voltage difference between the nodes N2 and N3 becomes smaller than the absolute value of the threshold voltage VT4 of the transistor Q4, the transistor Q4 turns on, and establishes an electrically conducting state between the nodes N1 and N2. When the control signal CNT2 is then raised from the L level to the H level, the transistor Q3 turns on, thereby decreasing a resistance between the nodes N1 and N2.

To establish an electrically non-conducting state between the nodes N1 and N2, the transistor Q3 is turned off by lowering the control signal CNT2 from the H level to the L level. The transistor Q2 is then turned off by lowering the control signal CNT1 from the H level to the L level. When the transistors Q2 and Q3 turn off, the leakage current of the transistor Q4 increases, causing the voltage at the node N3 to rise. If the voltage difference between the nodes N2 and N3 becomes larger than the absolute value of the threshold voltage VT4 of the transistor Q4, the transistor Q4 turns off, establishing the electrically non-conducting state between the nodes N1 and N2.

In the second embodiment, the second switching element (the transistor Q2 and the resistor R1) having a high on-resistance value switches the high breakdown voltage transistor Q4, thereby controlling the effect of variations in the threshold voltage VT4 of the transistor Q4 on variations in the drain current of the transistor Q4. Variations in the turn-on time are thus reduced.

The high breakdown voltage transistor Q4 having large variations in the threshold voltage VT4 is turned on by turning on the low breakdown voltage transistor Q2 having small variations in the threshold voltage VT2. Variations in the turn-on time are thus reduced.

In the second embodiment, the resistor R1 and the transistor Q2 are reverse-connected as illustrated in FIG. 8. As illustrated in FIG. 9, the threshold voltage VT3 of the transistor Q3 is configured to be higher than the threshold voltage VT2 of the transistor Q2, and the control signal CNT1 is applied to the gates of the transistors Q2 and Q3.

Figure 11:
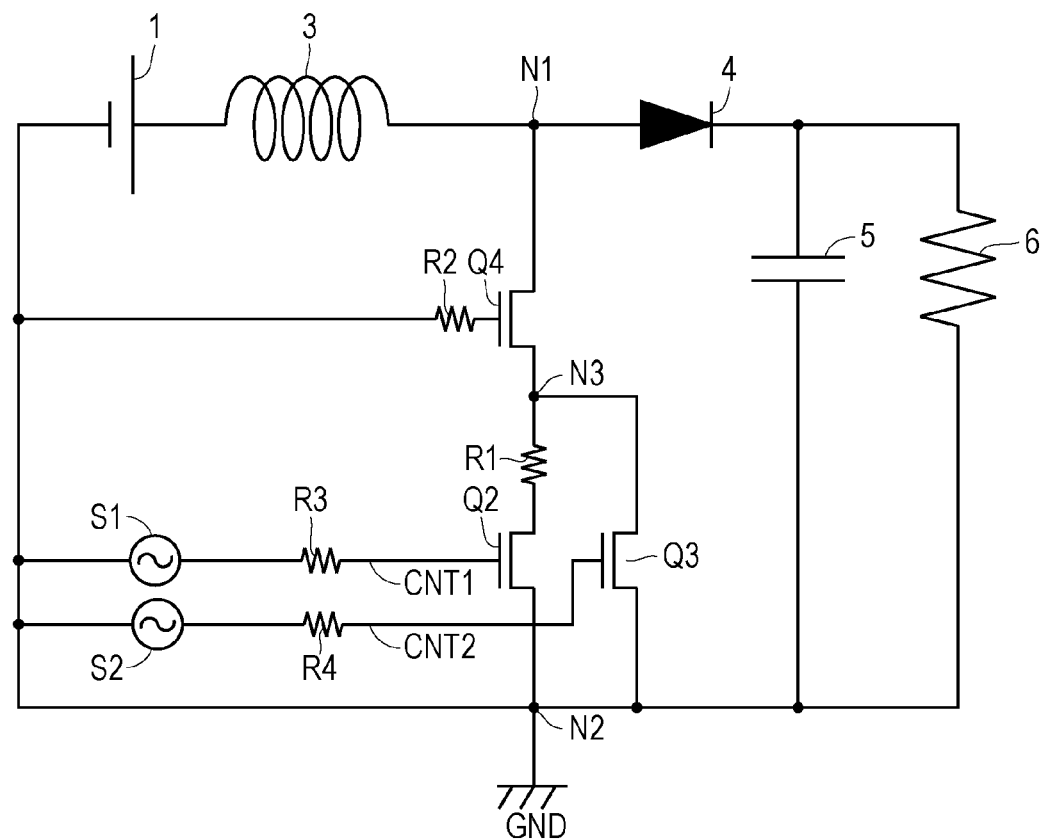
FIG. 11 is a circuit diagram illustrating a configuration of a boost chopper employing the semiconductor device of FIG. 10.

FIG. 11 is a circuit diagram illustrating a configuration of a boost chopper employing the semiconductor device of FIG. 10. The boost chopper of FIG. 11 is comparable in circuit configuration to the boost chopper of FIG. 2. The normally-on transistor Q4 is configured between the nodes N1 and N3 with the gate thereof connected to the ground voltage GND line via a gate resistor R2. The gate of the transistor Q4 may be directly grounded by removing the gate resistor R2.

When the transistors Q2 through Q4 are turned on, a current flows from the DC power source 1 to the ground voltage GND line through the reactor 3 and the transistors Q2 through Q4, thereby storing electromagnetic energy in the reactor 3. When the transistors Q2 through Q4 are turned off, electromagnetic energy stored in the reactor 3 is released to the capacitor 5 via the diode 4. The voltage across the capacitor 5, namely, the output voltage of the boost chopper is the sum of the output voltage of the DC power source 1 and the voltage across the reactor 3.

The boost chopper causes the second switching element (the transistor Q2 and the resistor R1) having a high on-resistance value to switch the high breakdown voltage transistor Q4, thereby controlling the effect of variations in the threshold voltage VT4 of the transistor Q4 on variations in the drain current of the transistor Q4. Variations in the rise time of current in the boost chopper are thus reduced.

Since the transistor Q4 having a higher absolute value of the threshold voltage VT4 is on-off controlled by on-off controlling the transistor Q2 having smaller variations in the threshold voltage VT2. In a similar way as in the first embodiment, variations in the rise time of current in the boost chopper are reduced.

The normally-on transistor Q4 may be replaced with the IGBT. In this case, as well, an effect similar to that of the second embodiment results.

Third Embodiment

The semiconductor device of a third embodiment of the disclosure includes multiple switching circuits between the first node and the second node. Each of the switching circuits includes a first switching element having a first electrode connected to the first node, a second switching element having a first electrode connected to a second electrode of the first switching element, and a second electrode connected to the second node, and a third switching element connected in parallel with the second switching element. A breakdown voltage between the first electrode and the second electrode of the first switching element is higher than a breakdown voltage between the first electrode and the second electrode of each of the second switching element and the third switching element. An on-resistance value of the second switching element is higher than an on-resistance value of the third switching element. Control electrodes of the first switching elements are connected together to a first control terminal. Control electrodes of the second switching elements are connected together to a second control terminal. Control electrodes of the third switching elements are connected together to a third control terminal. The semiconductor device of the third embodiment is described in detail with reference to the drawings.

Figure 12:
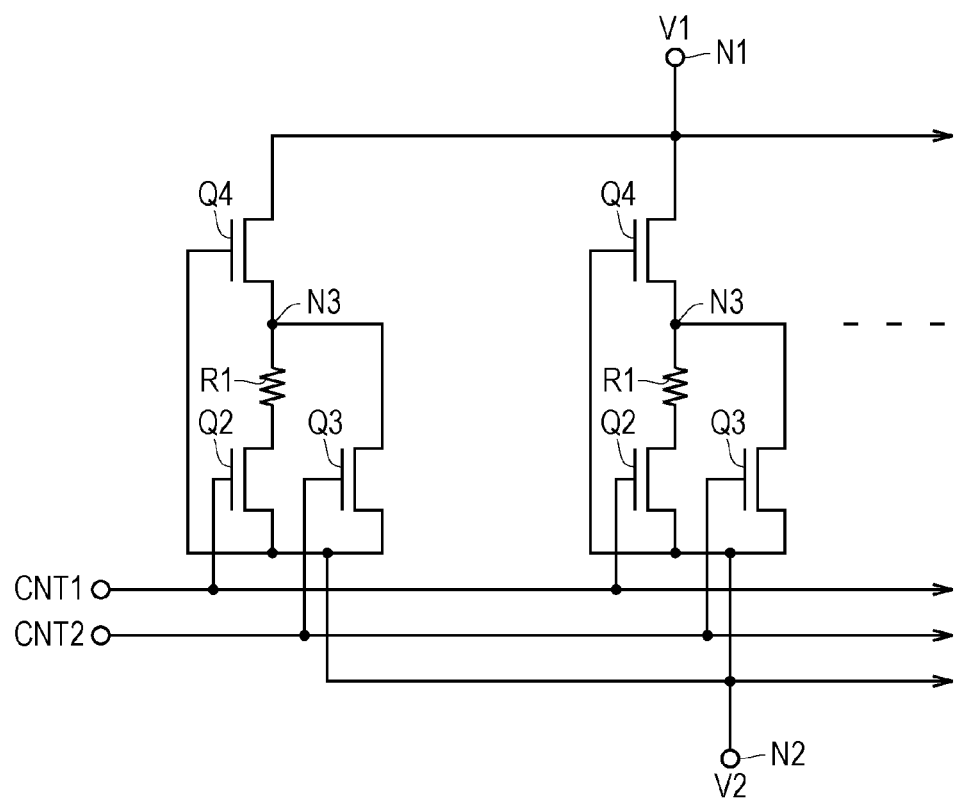
FIG. 12 is a circuit diagram illustrating a configuration of a semiconductor device of a third embodiment of the disclosure.

FIG. 12 is a circuit diagram illustrating a configuration of a semiconductor device of the third embodiment of the disclosure. The semiconductor device of FIG. 12 is comparable to the semiconductor device of FIG. 10. Referring to FIG. 12, the semiconductor device includes multiple semiconductor devices of FIG. 10 connected in parallel. More specifically, multiple transistors Q4 are configured with the drains thereof connected together to the node N1, and the gates thereof connected together to the node N2. Multiple transistors Q2 are configured with the sources thereof connected together to the node N2, and the gates thereof supplied with the control signal CNT1. Multiple transistors Q3 are configured with the sources thereof connected together to the node N2, and the gates thereof supplied with the control signal CNT2.

When the control signal CNT1 is raised from the L level to the H level, all the transistors Q2 turn on, and all the transistors Q4 turn on. Since the second switching element (the transistor Q2 and the resistor R1) having a higher on-resistance value turns on the high breakdown voltage transistor Q4. All the transistors Q4 thus turn on. If the node N3 is connected to the drain of the transistor Q2 by removing the resistor R1, the current concentrates on a single transistor Q4, and no current may flow through the other transistors Q4.

Since the current driving performance of the second switching element (the transistor Q2 and the resistor R1) is lower than the current driving performance of the transistor Q4, the transistor Q4 is unable to operate at a higher performance level under this condition. For this reason, the control signal CNT2 is raised from the L level to the H level, causing the low breakdown voltage transistor Q3 to turn on. This establishes an electrically conducting state between the nodes N1 and N2.

To establish an electrically non-conducting state between the nodes N1 and N2, the control signal CNT2 is lowered from the H level to the L level, causing all the transistors Q3 to turn off. In succession, the control signal CNT1 is lowered from the H level to the L level, thereby causing all the transistors Q2 and Q4 to turn off.

In the third embodiment, the low breakdown voltage transistor Q3 is turned on after the high breakdown voltage transistor Q4 is turned on by turning on the second switching element (the transistor Q2 and the resistor R1) having a higher on-resistance value. The third embodiment thus distributes current among all the transistors Q4 and thus controls a concentration of current on a single transistor Q4. The semiconductor device is simplified in configuration and low-cost designed without using a current sensor as disclosed in Japanese Unexamined Patent Application Publication No. 2002-95240.

Figure 13:
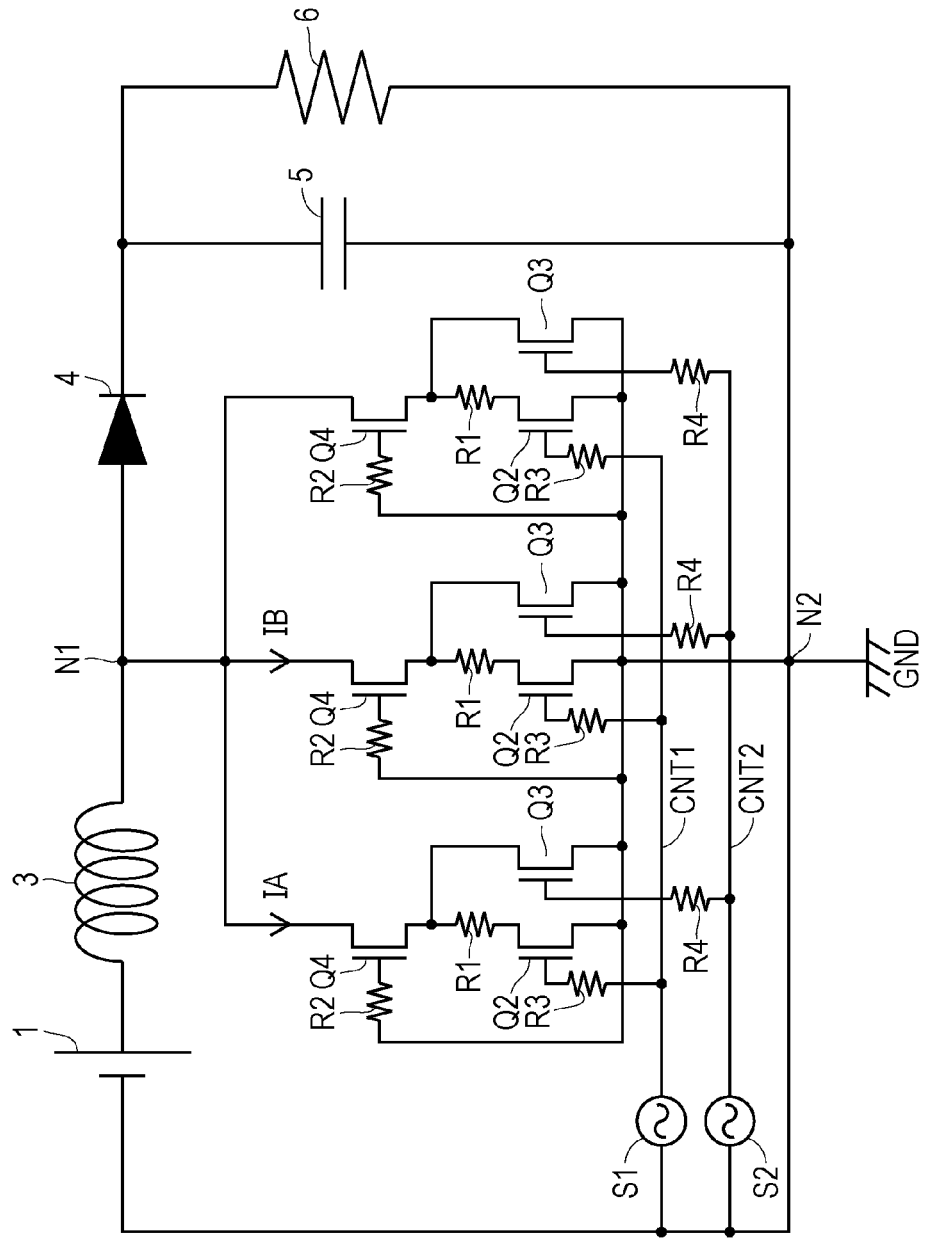
FIG. 13 is a circuit diagram illustrating a configuration of a boost chopper employing the semiconductor device of FIG. 12.

FIG. 13 is a circuit diagram illustrating a configuration of a boost chopper employing the semiconductor device of FIG. 12. The boost chopper of FIG. 13 is comparable to the boost chopper of FIG. 11. Referring to FIG. 13, three semiconductor devices, one of which is illustrated in FIG. 10, are connected in parallel. The gates of three normally-on transistors Q4 are respectively connected to the node N2 via the gate resistors R2. The gates of three transistors Q2 are respectively connected to the output node of a control signal source S1 via the gate resistors R3. The gates of three transistors Q3 are respectively connected to the output node of a control signal source S2 via the gate resistors R4.

The threshold voltages VT4 of the three transistors Q4 are −5.1 V, −4.6 V, and −4.6 V. The threshold voltages VT2 of the three transistors Q2 are respectively 2.17 V, 2.62 V, and 2.62 V. The threshold voltages VT3 of the three transistors Q3 are respectively 2.4 V, 2.6 V, and 2.6 V. The resistance of the resistor R1 is 1Ω, and the resistance of each of the gate resistors R2 through R4 is 100Ω.

When the transistors Q2 through Q4 are turned on, a current flows from the DC power source 1 to the ground voltage GND line through the reactor 3 and the transistors Q2 through Q4, thereby storing electromagnetic energy in the reactor 3. When the transistors Q2 through Q4 are turned off, electromagnetic energy stored in the reactor 3 is released to the capacitor 5 through the diode 4. The voltage across the capacitor 5, namely, the output voltage of the boost chopper is the sum of the output voltage of the DC power source 1 and the voltage across the reactor 3.

Figure 14A:
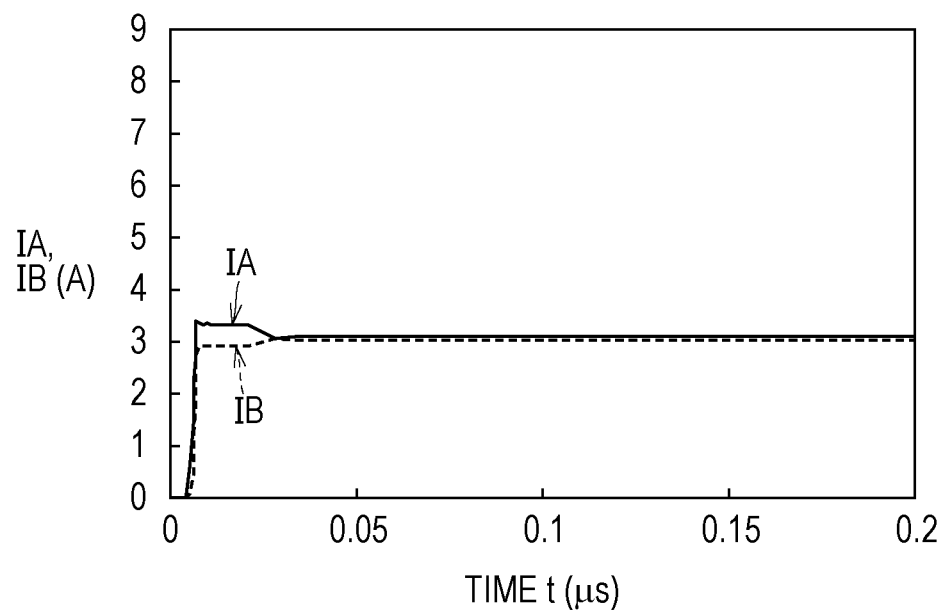
FIG. 14A and FIG. 14B are timing diagrams illustrating waveforms of currents flowing through two high breakdown voltage transistors of FIG. 13.

FIG. 14A is a timing diagram illustrating waveforms of a current IA flowing through the transistor Q4 on the left-hand side of FIG. 13 and a current IB flowing through the transistor Q4 in the center of FIG. 13 when the transistors Q2 through Q4 are turned on. When the transistors Q1, Q2, and Q4 are turned on at a given moment in FIG. 14A, the currents IA and IB increase together.

Figure 14B:
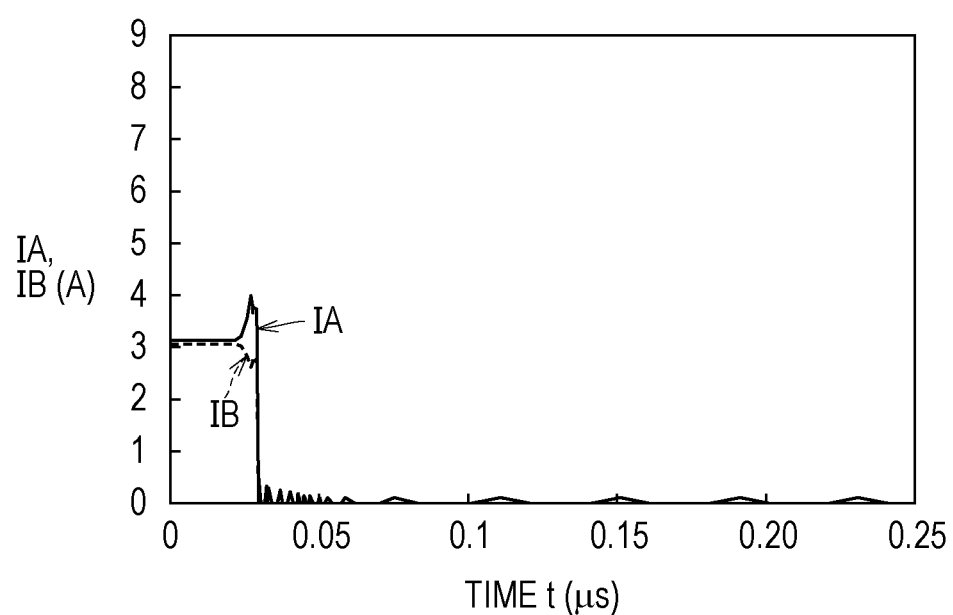

FIG. 14B is a timing diagram illustrating waveforms of the current IA flowing through the transistor Q4 on the left-hand side of FIG. 13 and the current IB flowing through the transistor Q4 in the center of FIG. 13 when the transistors Q2 through Q4 are turned off. If the transistors Q2, Q3, and Q4 are turned off at a given moment in FIG. 14B, the currents IA and IB decrease together. As illustrated in FIG. 14A and FIG. 14B, currents of approximately equal value flow through the two transistors Q4 at an almost identical timing.

Figure 15:
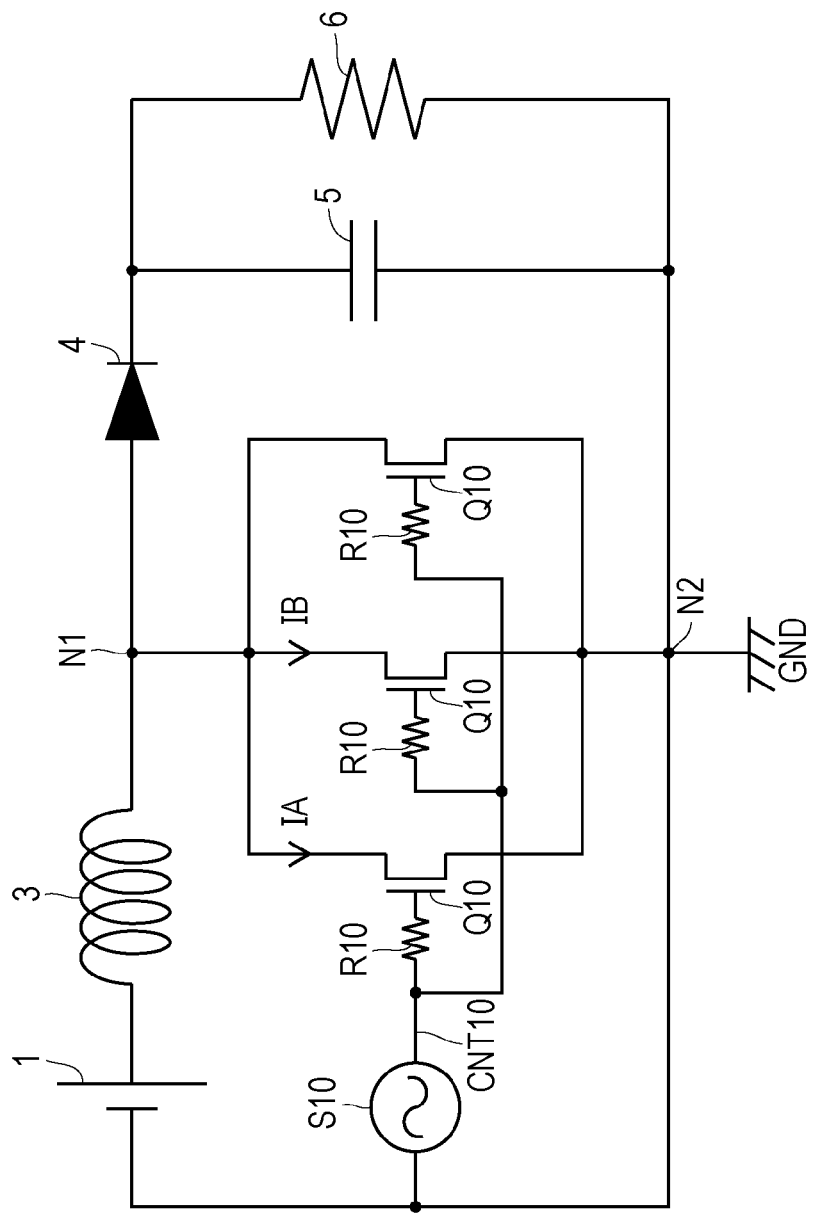
FIG. 15 is a circuit diagram illustrating a comparative example to the third embodiment.

FIG. 15 is a circuit diagram illustrating a related-art boost chopper serving as a comparative example to the third embodiment. The boost chopper of FIG. 15 is comparable in circuit configuration to the boost chopper of FIG. 4. Referring to FIG. 15, the boost chopper includes three N-channel MOS transistors Q10 connected in parallel between the nodes N1 and N2. The gates of the three transistors Q10 are respectively connected to the output node of a control signal source S10 via gate resistors R10. The control signal source S10 outputs a control signal CNT10 serving as a 10 kHz rectangular signal. The ground node of the control signal source S10 is grounded.

The threshold voltages VT10 of the three transistors Q10 are respectively 3.8 V, 5.3 V, and 5.3 V. The resistance of each of the three gate resistors R10 is 100Ω. The three transistors Q10 are equal to each other in terms of gate, drain, and source parasitic inductances.

When the control signal source S10 is raised from the L level (0 V, for example) to the H level (8 V, for example), the transistor Q10 turns on, storing electromagnetic energy in the reactor 3. When the control signal source S10 is lowered from the H level to the L level, the transistor Q10 turns off, releasing electromagnetic energy from the reactor 3 to the capacitor 5.

Figure 16A:
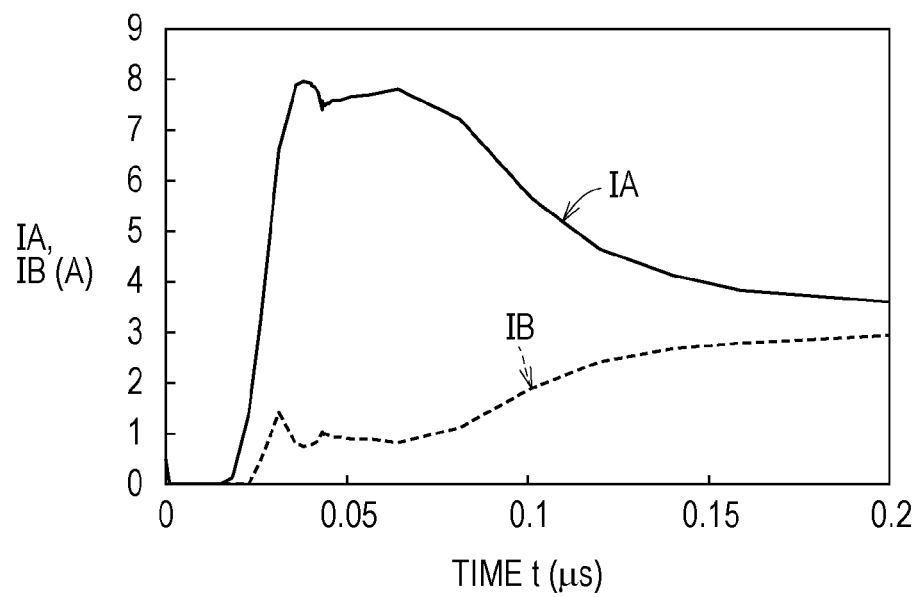
FIG. 16A and FIG. 16B are timing diagrams illustrating waveforms of currents flowing through two high breakdown voltage transistors of FIG. 15.

FIG. 16A is a timing diagram illustrating waveforms of a current IA flowing through the transistor Q10 on the left-hand side of FIG. 15 and a current IB flowing through the transistor Q10 in the center of FIG. 15 when the transistors Q10 are turned on. When the control signal CNT10 is raised from the L level to the H level in FIG. 16A at a given moment, the transistor Q10 on the left-hand side having a lower threshold voltage turns on prior to the transistor Q10 in the center, the current IA flowing through the transistor Q10 on the left-hand side sharply increases. The transistor Q10 in the center having a higher threshold voltage turns on next, and the current IB flowing through the transistor Q10 in the center increases while the current IA flowing through the transistor Q10 on the left-hand side decreases.

Figure 16B:
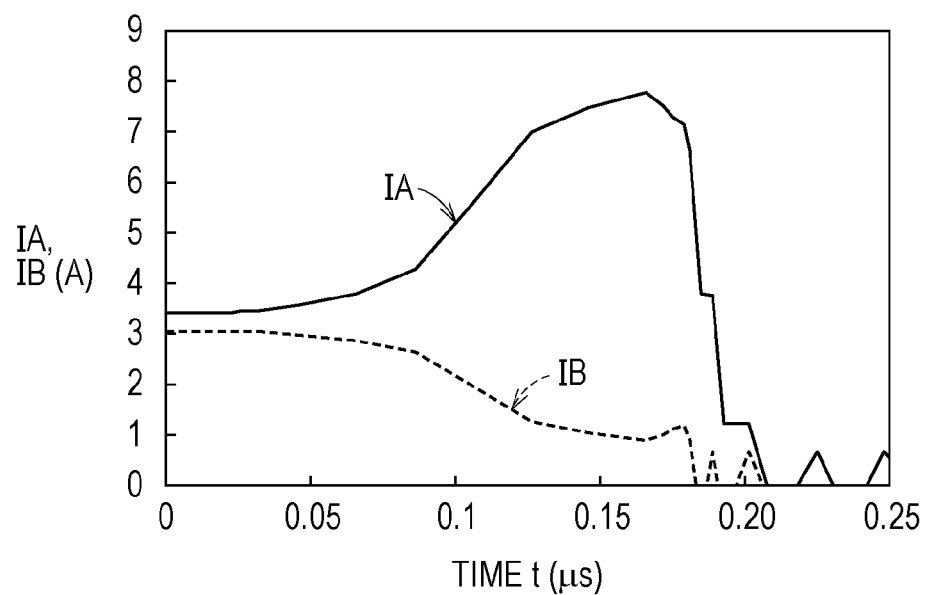

FIG. 16B is a timing diagram illustrating waveforms of the current IA flowing through the transistor Q10 on the left-hand side of FIG. 15 and the current IB flowing through the transistor Q10 in the center of FIG. 15 when the transistors Q10 are turned off. When the control signal CNT10 is lowered from the H level to the L level in FIG. 16B at a given moment, the transistor Q10 in the center having a higher threshold voltage turns off prior to the transistor Q10 on the left-hand side, the current IB flowing through the transistor Q10 in the center decreases while the current IA increases rapidly. The transistor Q10 on the left-hand side having a lower threshold voltage turns off, decreasing the current IA.

In the related-art boost chopper, current concentrates in a single transistor Q10 having a lower threshold voltage from among the multiple transistors Q10 connected in parallel. It is contemplated that the threshold voltage of the transistor Q10 is measured beforehand and that a boost chopper is manufactured using multiple transistors Q10 having an equal threshold voltage. But this method is costly. The method disclosed in Japanese Unexamined Patent Application Publication No. 2002-95240 leads to a complicated and costly apparatus as previously described.

In contrast, the boost chopper of the disclosure has a simple structure, allows equal currents to respectively flow through multiple transistors Q4, and is thus free from a damage as a result of current concentration in a single transistor Q4.

Figure 17A:
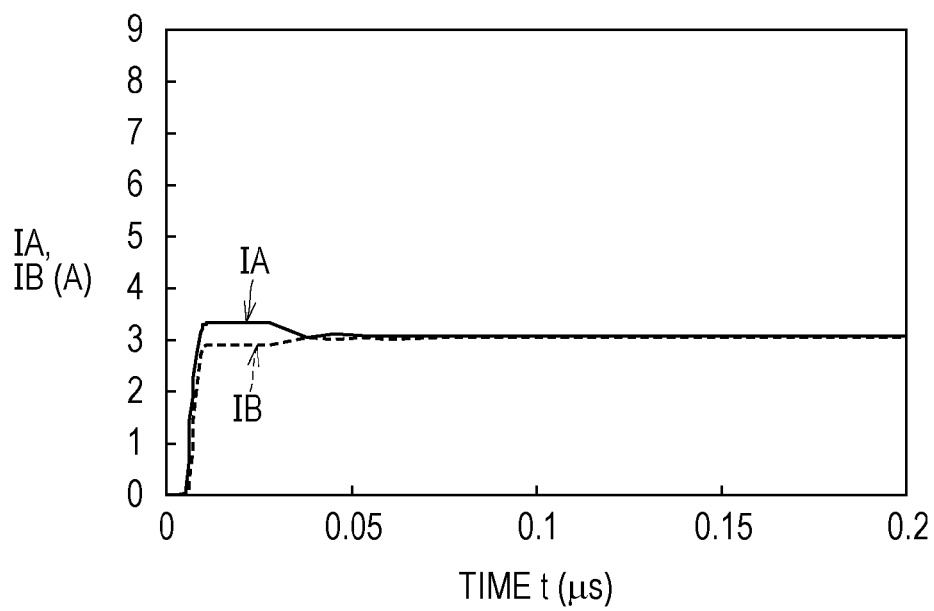
FIG. 17A and FIG. 17B are timing diagrams illustrating a modification of the third embodiment.
Figure 17B:
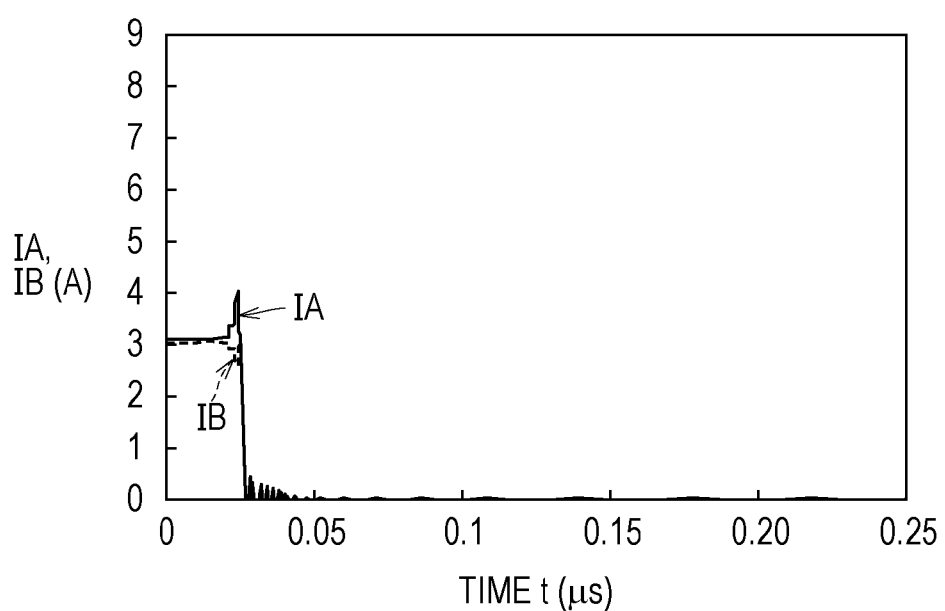

In the third embodiment, the resistor R2 and the transistor Q2 are serially connected between the source of the transistor Q4 and the node N2. If the resistor R2 and the transistor Q2 are reversed in connection, in other words, if the transistor Q2 and the resistor R2 are serially connected in this order between the source of the transistor Q4 and the node N2, a similar effect results. FIG. 17A is a timing diagram illustrating waveforms of the current IA flowing through the transistor Q4 on the left-hand side of FIG. 13 and the current IB flowing through the transistor Q4 in the center of FIG. 13 when the transistors Q2 through Q4 are turned on with the resistor R2 and the transistor Q2 in the reverse connection. FIG. 17B is a timing diagram illustrating waveforms of the current IA flowing through the transistor Q4 on the left-hand side of FIG. 13 and the current IB flowing through the transistor Q4 in the center of FIG. 13 when the transistors Q2 through Q4 are turned off with the resistor R2 and the transistor Q2 in the reverse connection. In this modification, equal currents are flown through the multiple transistors Q4 as illustrated in FIG. 17A and FIG. 17B.

Fourth Embodiment

Figure 18:
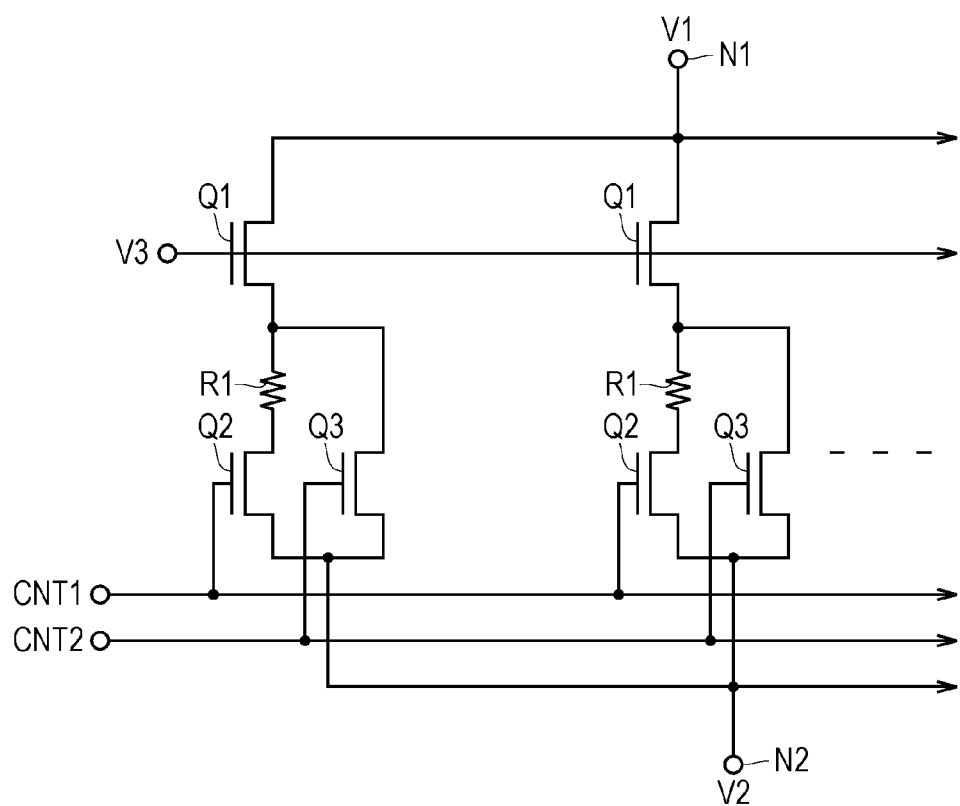
FIG. 18 is a circuit diagram illustrating a configuration of a semiconductor device of a fourth embodiment.

FIG. 18 is a circuit diagram illustrating a configuration of a semiconductor device of a fourth embodiment. The semiconductor device of FIG. 18 is comparable in circuit configuration to the semiconductor device of FIG. 1. Referring to FIG. 18, the semiconductor device includes multiple semiconductor devices, one of which is illustrated in FIG. 1, connected in parallel. Multiple transistors Q1 are configured with the drains thereof connected together to the node N1, and with the gates thereof supplied with a DC voltage V3. Multiple transistors Q2 are configured with the sources thereof connected together to the node N2, and with the gates thereof supplied with a control signal CNT1. Multiple transistors Q3 are configured with the sources thereof connected together to the node N2, and with the gates thereof supplied with a control signal CNT2.

When the control signal CNT1 is raised from the L level to the H level, all transistors Q2 are turned on, and all transistors Q1 are turned on. Since the high breakdown voltage transistor Q1 is turned on by turning on the second switching element (the transistor Q2 and the resistor R1) having a higher on-resistance value, all transistors Q1 are thus turned on. If the drain of the transistor Q2 is connected to the node N3 by removing the resistor R1, current may concentrate in a single transistor Q1 with no current flowing through the other transistors Q1.

Since the current driving performance of the second switching element (the transistor Q2 and the resistor R1) is lower than the current driving performance of the transistor Q1, the transistor Q1 is unable to operate at a higher performance level under this condition. For this reason, the control signal CNT2 is raised from the L level to the H level, causing the low breakdown voltage transistor Q3 to turn on. This establishes an electrically conducting state between the nodes N1 and N2.

To establish an electrically non-conducting state between the nodes N1 and N2, the control signal CNT2 is lowered from the H level to the L level, causing all the transistors Q3 to turn off. In succession, the control signal CNT1 is lowered from the H level to the L level, thereby causing all the transistors Q1 and Q2 to turn off.

In the fourth embodiment, the low breakdown voltage transistor Q3 is turned on after the high breakdown voltage transistor Q1 is turned on by turning on the second switching element (the transistor Q2 and the resistor R1). The fourth embodiment thus distributes current among all the transistors Q1 and thus controls a concentration of current on a single transistor Q1. The semiconductor device is simplified in configuration and low-cost designed without using the current sensor as disclosed in Japanese Unexamined Patent Application Publication No. 2002-95240.

Figure 19:
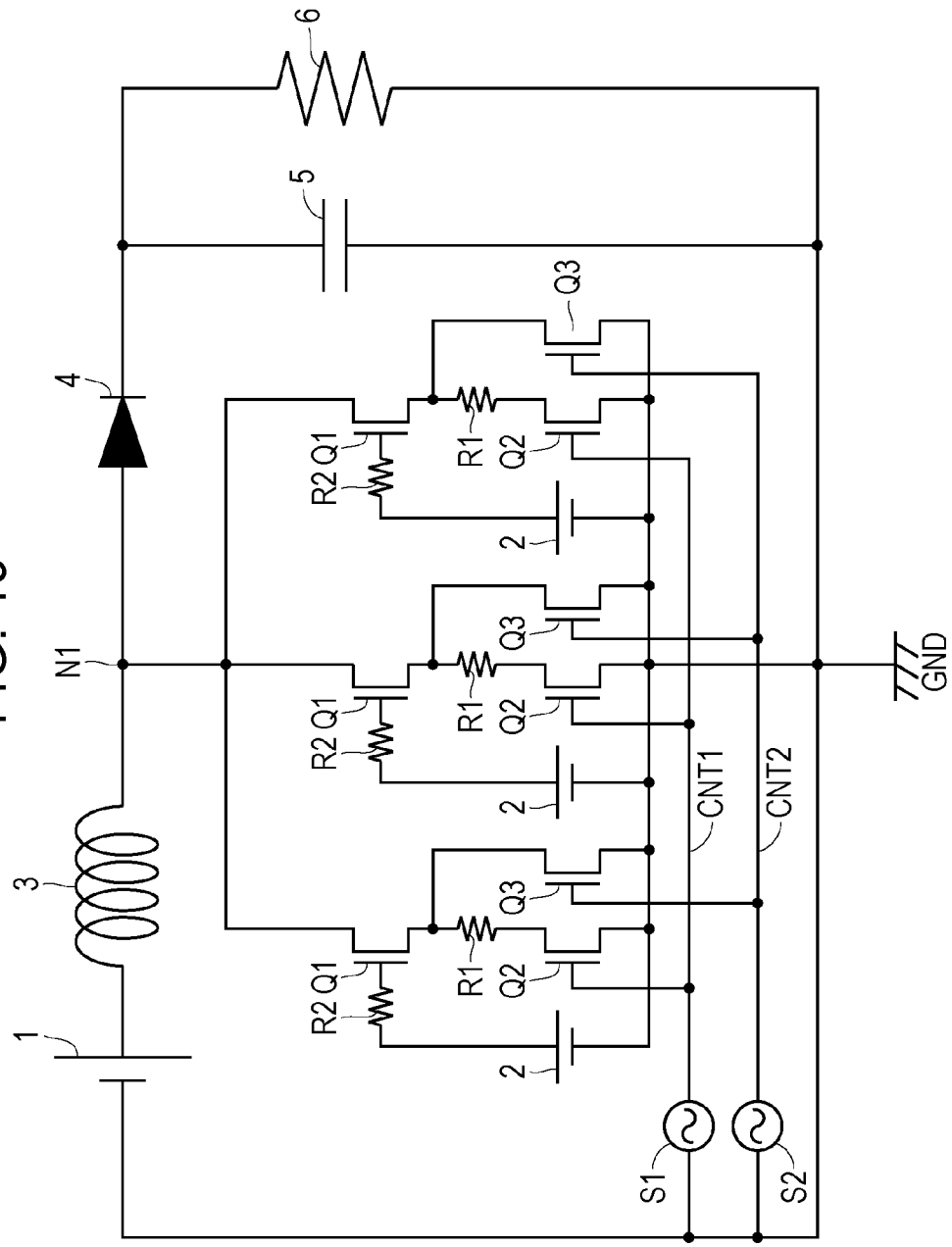
FIG. 19 is a circuit diagram illustrating a configuration of a boost chopper employing the semiconductor device of FIG. 18.

FIG. 19 is a circuit diagram illustrating a configuration of a boost chopper employing the semiconductor device of FIG. 18. The boost chopper of FIG. 19 is comparable in circuit configuration to the boost chopper of FIG. 2. Referring to FIG. 19, the boost chopper includes three semiconductor devices, one of which is illustrated in FIG. 1, connected in parallel. The gates of three transistors Q1 are respectively connected to positive electrodes of DC power sources 2 through gate resistors R2, and are supplied with a DC voltage V3. The gates of three transistors Q2 are connected to the output node of a control signal source S1. The gates of three transistors Q3 are connected to the output node of a control signal source S2.

The threshold voltages VT1 of the three transistors Q1 are respectively 4.2 V, 4.0 V, and 4.0 V. The threshold voltages VT2 of the three transistors Q2 are respectively 1.2 V, 1.4 V, and 1.4 V. The threshold voltages VT3 of the three transistors Q3 are respectively 1.4 V, 1.6 V, and 1.6 V. The resistance of the gate resistors R2 is 10Ω.

When the transistors Q1 through Q3 are turned on, a DC current flows from the DC power source 1 to the ground voltage GND line through the reactor 3 and the transistors Q1 through Q3, thereby storing electromagnetic energy in the reactor 3. When the transistors Q1 through Q3 are turned off, electromagnetic energy stored in the reactor 3 is released to the capacitor 5 through the diode 4. The voltage across the capacitor 5, namely, the output voltage of the boost chopper is the sum of the output voltage of the DC power source 1 and the voltage across the reactor 3. In this boost chopper, equal currents flow through the three transistors Q1 in a similar way as in the boost chopper of the third embodiment.

The first through fourth embodiments and the modifications thereof may be used in combination.

Fifth Embodiment

In accordance with a fifth embodiment, numerical ranges of a resistance r (Ω) of the resistor R1 and the conductance Gm (S) of a transistor Q2 are described. The conductance Gm (S) of the transistor Q2 is determined by the drain-source rated voltage and the drain rated current of the transistor Q2.

Figure 20:
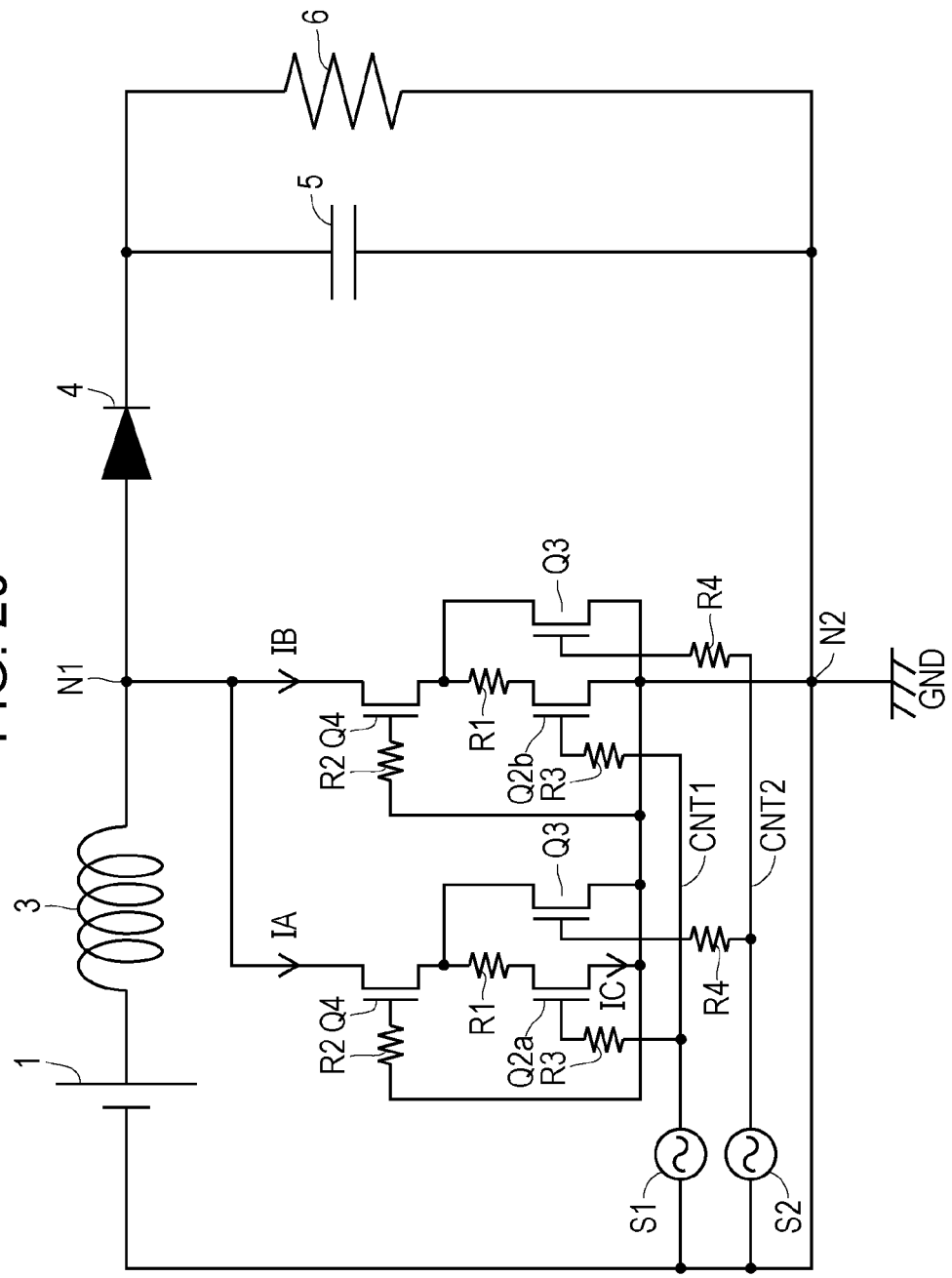
FIG. 20 is a circuit diagram illustrating a configuration of a boost circuit of a fifth embodiment of the disclosure.

FIG. 20 is a circuit diagram illustrating a boost circuit that serves the purpose of studying the numerical ranges of the resistance r and the conductance Gm. The boost circuit of FIG. 20 is comparable in circuit configuration to the boost chopper of FIG. 13. Referring to FIG. 20, the boost chopper includes two semiconductor devices of FIG. 10 connected in parallel.

One semiconductor device includes a transistor Q4, a resistor R1, and a transistor Q2a serially connected between nodes N1 and N2, and a transistor Q3 connected between the source of the transistor Q4 and the node N2.

The other semiconductor device includes a transistor Q4, a resistor R1, and a transistor Q2b serially connected between the nodes N1 and N2, and a transistor Q3 connected between the source of the transistor Q4 and the node N2.

The fifth embodiment handles variations in the threshold voltages of low breakdown voltage transistors Q2a and Q2b that form the second switching elements cause an imbalance between the currents IA and IB respectively flowing through the transistors Q2a and Q2b. The imbalance may be reduced by configuring the resistance r (Ω) of the resistor R1 and the conductances Gm (S) of the transistors Q2a and Q2b to be appropriate values in the fifth embodiment.

The boost circuit boosts an input voltage of 150 V (the output voltage of the DC power source 1) to 300 V by periodically turning on and off the semiconductor device with a predetermined period, and outputs the boosted voltage to a load circuit 6. The operation of the boost circuit is identical to that of the boost circuit of FIG. 13, and the discussion thereof is thus omitted herein.

In the boost circuit, the peak values of the currents IA and IB flowing through the transistors Q2a and Q2b, when turned on, are to be equal to or below the absolute rated current IH of the transistors Q2a and Q2b. If one of the currents IA and IB flowing through the transistors Q2a and Q2b exceeds the absolute rated current IH even for a slight moment, the reliability of the transistors Q2a and Q2b is difficult to guarantee, and possibly the transistors Q2a and Q2b could be damaged. The absolute rated current IH is a function of the conductance Gm, and the higher the conductance Gm is, the higher the absolute rated current IH is.

Figure 21A:
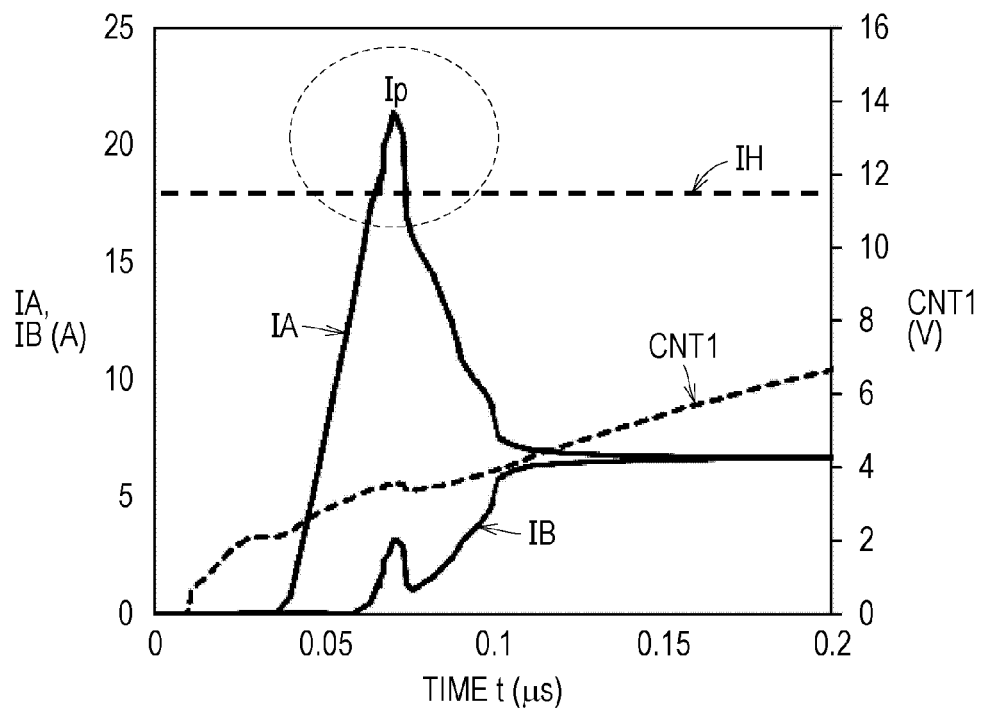
FIG. 21A and FIG. 21B are timing diagrams illustrating a relationship between waveforms of currents flowing through the resistance of the resistor and the transistors of FIG. 20.
Figure 21B:
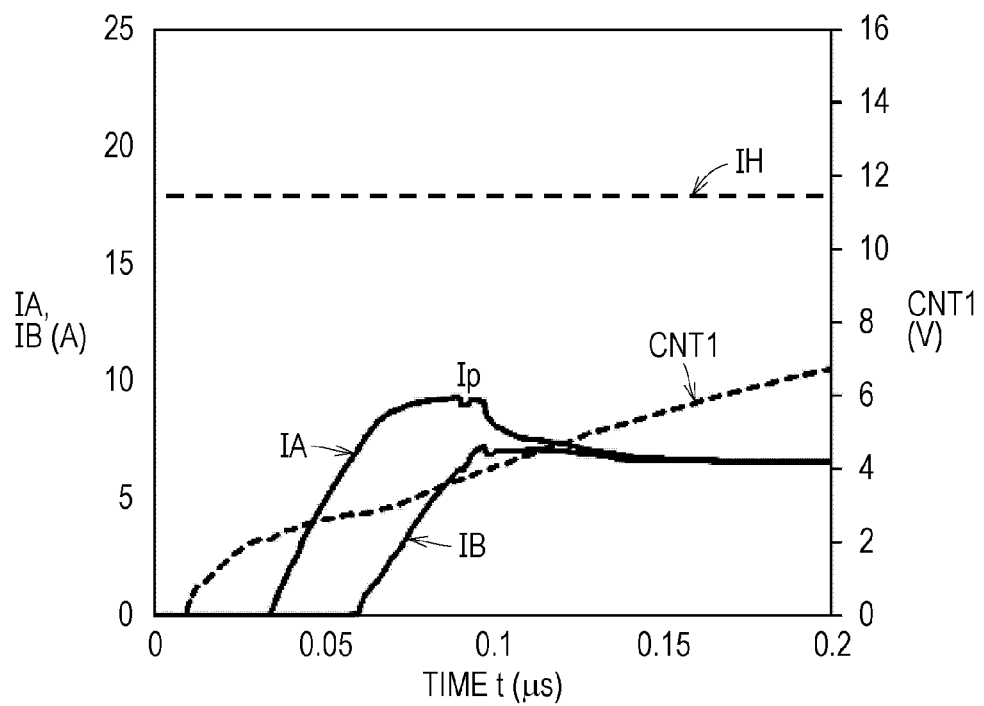

FIG. 21A and FIG. 21B are time charts illustrating waveforms of the currents IA and IB of the transistors Q2a and Q2b when the control signal CNT1 is raised from the L level to the H level. FIG. 21A illustrates the waveforms of the current IA and IB with the resistance r of the resistor R1 being 25 mΩ, and FIG. 21B illustrates the waveforms of the current IA and IB with the resistance r of the resistor R1 being 300 mΩ.

The threshold voltages of the transistors Q2a and Q2b may vary. For example, the threshold voltage VT2a of the transistor Q2a may now be 1 V, and the threshold voltage VT2b of the transistor Q2b may now be 2 V. Each of the absolute rated currents IH of the transistor Q2a and Q2b may now be 18 A. Each of the conductances Gm of the transistors Q2a and Q2b may now be 26 S.

When the control signal CNT1 rises in voltage (V) from the L level to the H level, and exceeds the threshold voltages VT2a and VT2b of the transistors Q2a and Q2b as illustrated in FIG. 21A and FIG. 21B, the transistors Q2a and Q2b are turned on. Since the threshold voltage VT2a (=1 V) of the transistor Q2a is lower than the threshold voltage VT2b (=2 V) of the transistor Q2b, the transistor Q2a is first turned on, and then the transistor Q2b is turned on.

When the transistor Q2a is turned on, the current IA of the transistor Q2a sharply increases. When the transistor Q2b is turned on next, the current IB of the transistor Q2b increases while the current IA of the transistor Q2a decreases.

Since the resistance r of the resistor R1 is lower under the condition of FIG. 21A, the current IA flowing through the transistor Q2a is not sufficiently limited and the peak value Ip of the current IA may exceed the absolute rated current IH (an area enclosed by a broken-lined circle in FIG. 21A). The reliability of the transistor Q2a is not guaranteed, and the transistor Q2a could be damaged. Under this condition (with r=25 mΩ), the reliability of the transistor Q2a is not guaranteed.

In contrast, the resistance r of the resistor R1 is higher under the condition of FIG. 21B. The current IA flowing through the transistor Q2a is sufficiently limited and the peak value Ip of the current IA is thus limited to a value below the absolute rated current IH. Under this condition (with r=300 mΩ), the reliability of the transistor Q2a is guaranteed.

The conductances Gm of the transistors Q2a and Q2b may be modified at multi levels, and the resistance r of the resistor R1 is modified at multi levels at each level of conductance Gm. The currents IA and IB flowing through the transistors Q2a and Q2b are determined under each condition in simulation. A ratio K1=Ip/IH, namely, a ratio of the peak value Ip of the current IA flowing through the transistor Q2a under each condition to the absolute rated current IH of the transistor Q2a is determined under each condition.

The absolute rated current IH of the transistor Q2a varies in response to the conductance Gm of the transistor Q2a. A relationship between the absolute rated current IH and the conductance Gm is determined from a datasheet of an actual transistor used as the transistor Q2a.

Figure 22:
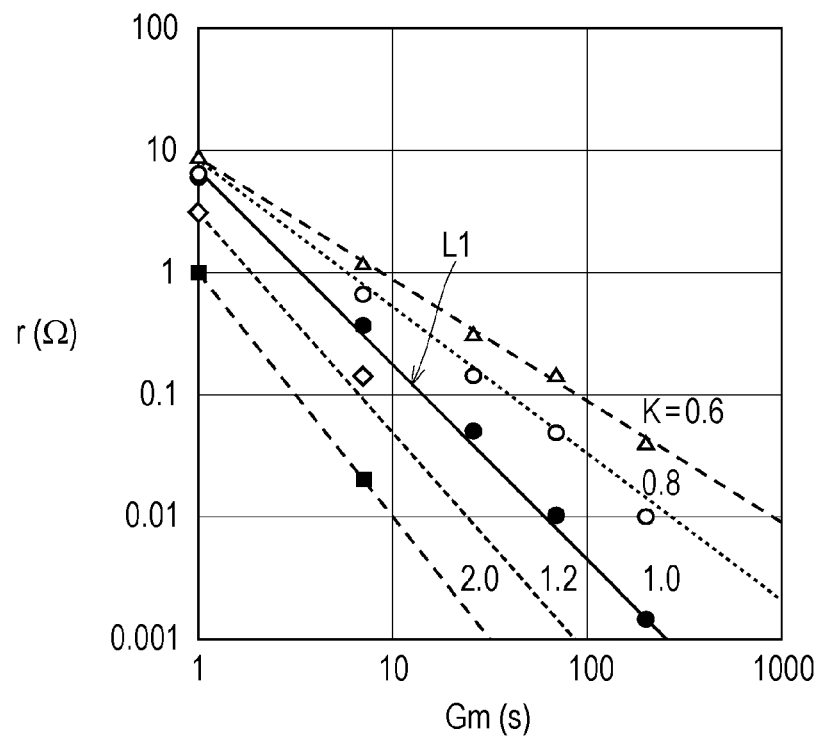
FIG. 22 illustrates a relationship of the resistance of the resistor, a conductance of the transistor, and a ratio an absolute rated current to a peak value of the current flowing through the transistor illustrated in FIG. 20.

FIG. 22 illustrates a relationship of the conductance Gm (S) of the transistor Q2a, a resistance r (Ω) of the resistor R1, and K1=Ip/IH. In FIG. 22, the abscissa represents the conductance Gm (S), the ordinate represents the resistance r (Ω), and symbols represent K values (0.6, 0.8, 1.0, 1.2, and 2.0) obtained under the conditions. Lines are respectively drawn to connect the same symbol values.

The line L1 represents the condition K1=1.0. If K1 exceeds 1.0, the reliability of the transistor Q2a is not guaranteed, and the transistor Q2a could be damaged. The resistance r is to be on the line L1 or higher. The line L1 is expressed by formula r=7×Gm$^{-1.6}$. To control damage on the transistor Q2a, r≥7×Gm$^{-1.6}$ is to be satisfied.

The conductance Gm of the transistor Q2 may be modified at multi levels, and the resistance r of the resistor R1 is modified at multi level at each level of conductance Gm. The currents IA and IB flowing through the transistors Q2a and Q2b are determined under each condition in simulation. A ratio K2=IC/IR, namely, a ratio of the value of the currents IA and IB flowing through the transistors Q2a and Q2b under each condition (for example, the value IC of IA=IB at t=0.2 μs in FIG. 21A and FIG. 21B) to a rated current IR of each of the transistors Q2a and Q2b is determined under each condition.

Figure 23:
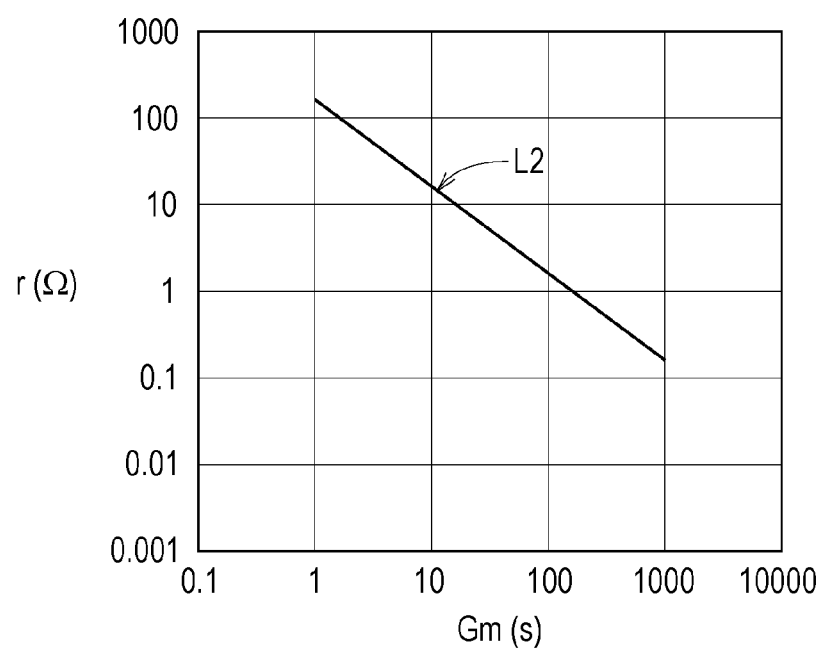
FIG. 23 illustrates a condition under which the transistor of FIG. 20 is to be used.

FIG. 23 illustrates a relationship of the conductance Gm (S) of each of the transistors Q2a and Q2b, a resistance r (Ω) of the resistor R1, and K2=IC/IR. In FIG. 23, the abscissa represents the conductance Gm (S), the ordinate represents the resistance r (Ω), and a line L2 represents a condition of K2=0.05. Under the condition that a current equal to or above 5 percent of the rated current IR does not flow through each of the transistors Q2a and Q2b, performance of the transistors Q2a and Q2b is not fully utilized, and this condition is not realistic. The line L2 is expressed by formula r=170×Gm$^{-1}$. To fully utilize the performance of the transistors Q2a and Q2b, the relationship r≤170×Gm$^{-1}$ is to be satisfied.

The conductance Gm of each of the transistors Q2a and Q2b corresponds to a current capacity of each of the transistors Q2a and Q2b, and is limited to a predetermined range depending on applications and practicalities. For example, to increases the conductance Gm of a MOS transistor by ten times, the gate length W is also to be increased by ten times. Commercially available MOS transistors have typically a conductance Gm within a range of from 1 to 1000, and a gate length W within a range of from 275 nm to 275 μm.

Nano-sized MOS transistors having a conductance Gm within a range of from 0.1 to 1 and a gate length W of 27.5 nm are not commercially available. High-powered MOS transistors having a conductance Gm within a range of from 1000 to 10000 and a gate length W of 2.75 mm are under development but not yet commercially available. The conductance Gm of a transistor practically usable in the semiconductor device of the disclosure falls within a range of 1≤Gm≤1000.

Figure 24:
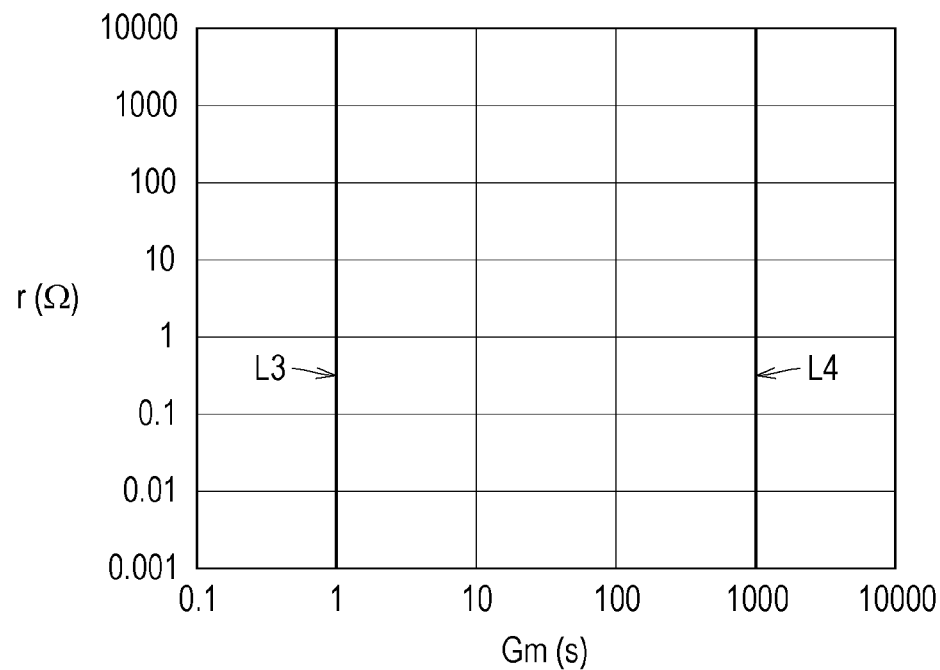
FIG. 24 illustrates a transistor condition under which the transistor of FIG. 20 is usable.

FIG. 24 illustrates the range of the conductance Gm of a usable transistor. Referring to FIG. 24, a line L3 represents Gm=1, and a line L4 represents Gm=1000. The range of the conductance Gm of the usable transistor is between the lines L3 and L4.

Figure 25:
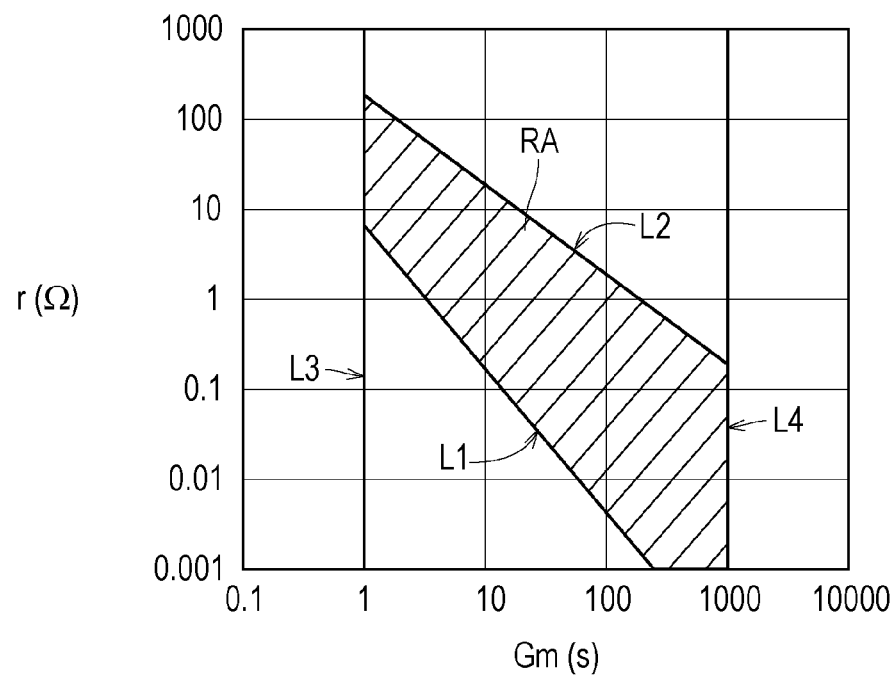
FIG. 25 illustrates numerical ranges of the resistance of the resistor and of the conductance of the transistor illustrated in FIG. 20.

FIG. 25 illustrates summarized results, namely, numerical ranges of the resistance r (Ω) of the resistor R1, and the conductance Gm (S) of the transistor Q2. Referring to FIG. 25, the values of r and Gm are limited to an area RA enclosed by lines L1 through L4. More specifically, the range of the conductance Gm is configured to be 1≤Gm≤1000 and the range of the resistance r is configured to be 7×Gm$^{-1.6}$≤r≤170×Gm$^{-1}$.

In accordance with the fifth embodiment, the range of the conductance Gm (S) of the transistor Q2 is configured to be 1≤Gm≤1000 and the range of the resistance r (Ω) of the resistor R1 is configured to be 7×Gm$^{-1.6}$≤r≤170×Gm$^{-1}$. The low breakdown voltage Q2 is used. Current imbalance caused by variations in the threshold voltage of the low breakdown voltage transistor Q2 is controlled. The reliability of the transistor Q2 may thus be guaranteed.

The present disclosure contains subject matter related to that disclosed in Japanese Priority Patent Application JP 2015-194087 filed in the Japan Patent Office on Sep. 30, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising a plurality of switching circuits connected in parallel between a first node and a second node, each of the switching circuits including:
   a first switching element having a first electrode connected to the first node;
   a second switching element having a first electrode connected to a second electrode of the first switching element, and a second electrode connected to the second node; and
   a third switching element connected in parallel with the second switching element,
   wherein a breakdown voltage between the first electrode and the second electrode of the first switching element is higher than a breakdown voltage between the first electrode and the second electrode of each of the second switching element and the third switching element,
   wherein an on-resistance value of the second switching element is higher than an on-resistance value of the third switching element,
   wherein control electrodes of the first switching elements are connected together to a first control terminal;
   wherein control electrodes of the second switching elements are connected together to a second control terminal;
   wherein control electrodes of the third switching elements are connected together to a third control terminal;
   wherein the first switching element includes a first transistor,
   wherein the second switching element includes a first resistor and a second transistor connected in series,
   wherein the third switching element includes a third transistor, and
   wherein 1≤Gm≤1000 and 7×Gm$^{-1.6}$≤r≤170×Gm$^{-1}$ hold where r represents a resistance (Ω) of the first resistor and Gm is a conductance (S) of the second transistor.

2. The semiconductor device according to claim 1, wherein the first through third transistors are normally-off transistors.

3. The semiconductor device according to claim 1, wherein the first transistor is a normally-on transistor and wherein the second and third transistors are normally-off transistors.

4. The semiconductor device according to claim 1, further comprising:

a second resistor that is arranged for the first switching element, and connected between the control electrode of the first switching element and the first control terminal;

a third resistor that is arranged for the second switching element and connected between the control electrode of the second switching element and the second control terminal; and a fourth resistor that is arranged for the third switching element and connected between the control electrode of the third switching element and the third control terminal.

5. The semiconductor device according to claim 1, wherein the first node is supplied with a first voltage, wherein the second node is supplied with a second voltage, wherein the first control terminal is supplied with a third voltage, wherein the second control terminal is supplied with a first control signal that on-off controls the second switching element, and wherein the third control terminal is supplied with a second control signal that on-off controls the third switching element.

6. The semiconductor device according to claim 1, wherein the first node is supplied with a first voltage, wherein the second node is supplied with a second voltage, wherein the first control terminal is supplied with a third voltage, wherein a threshold voltage of the second switching element is lower than a threshold voltage of the third switching element, and wherein the second and third control terminals are respectively supplied with control signals that on-off control the second and third switching elements.

7. The semiconductor device according to claim 1, wherein in order to establish an electrically conducting state between the first node and the second node, the third switching elements are turned on after turning on the first switching elements by turning on the second switching elements.

8. The semiconductor device according to claim 1, wherein in order to establish an electrically non-conducting state between the first node and the second node, the first switching elements are turned off by turning off the second switching elements subsequent to turning off the third switching elements.

9. A semiconductor device comprising:

a first switching element having a first electrode connected to a first node;

a second switching element having a first electrode connected to a second electrode of the first switching element, and a second electrode connected to a second node; and a third switching element connected in parallel with the second switching element, wherein a breakdown voltage between the first electrode and the second electrode of the first switching element is higher than a breakdown voltage between the first electrode and the second electrode of each of the second switching element and the third switching element, wherein an on-resistance value of the second switching element is higher than an on-resistance value of the third switching element, wherein in order to establish an electrically conducting state between the first node and the second node, the third switching element is turned on after turning on the first switching element by turning on the second switching element, wherein the first switching element includes a first transistor, wherein the second switching element includes a resistor and a second transistor connected in series, wherein the third switching element includes a third transistor, and wherein $1 \leq Gm \leq 1000$ and $7 \times Gm^{-1.6} \leq r \leq 170 \times Gm^{-1}$ hold where r represents a resistance ($\Omega$) of the resistor and Gm is a conductance (S) of the second transistor.

10. A converter comprising the semiconductor device according to claim 1.

11. An inverter comprising the semiconductor device according to claim 1.

12. A power conversion device comprising the semiconductor device according to claim 1.

* * * * *